United States Patent
Yuzurihara et al.

(10) Patent No.: US 10,475,624 B2
(45) Date of Patent: Nov. 12, 2019

(54) HIGH-FREQUENCY POWER SUPPLY DEVICE, AND CONTROL METHOD FOR HIGH-FREQUENCY POWER SUPPLY DEVICE

(71) Applicant: KYOSAN ELECTRIC MFG. CO., LTD., Yokohama-shi, Kanagawa (JP)

(72) Inventors: Itsuo Yuzurihara, Yokohama (JP); Ryosuke Ohma, Yokohama (JP)

(73) Assignee: KYOSAN ELECTRIC MFG. CO., LTD., Yokohama-shi (JP)

( * ) Notice: Subject to any disclaimer, the term of this patent is extended or adjusted under 35 U.S.C. 154(b) by 0 days.

(21) Appl. No.: 16/314,967

(22) PCT Filed: Sep. 7, 2016

(86) PCT No.: PCT/JP2016/076299
§ 371 (c)(1),
(2) Date: Jan. 3, 2019

(87) PCT Pub. No.: WO2018/008164
PCT Pub. Date: Jan. 11, 2018

(65) Prior Publication Data
US 2019/0311885 A1    Oct. 10, 2019

(30) Foreign Application Priority Data
Jul. 8, 2016 (JP) .................. 2016-136058

(51) Int. Cl.
*H01J 37/32* (2006.01)
*H03H 7/38* (2006.01)
(Continued)

(52) U.S. Cl.
CPC .. *H01J 37/32183* (2013.01); *H01J 37/32266* (2013.01); *H03H 7/40* (2013.01); *H05H 2001/4682* (2013.01)

(58) Field of Classification Search
CPC .......... H01J 37/32174; H01J 37/32183; H01J 37/32082; H01J 37/32266; H03H 7/24; H03H 7/38; H03H 7/40; H05H 2001/4682
See application file for complete search history.

(56) References Cited

U.S. PATENT DOCUMENTS 7,839,223 B2 * 11/2010 Van Zyl ............ H01J 37/32082
                                                        315/111.21
9,041,471 B2 *  5/2015 Coumou ................. H03F 3/191
                                                        330/305
(Continued)

FOREIGN PATENT DOCUMENTS

CN    103187968 A    7/2013
EP    2611029 A2     7/2013
(Continued)

OTHER PUBLICATIONS

International Search Report dated Oct. 18, 2016, issued in counterpart application No. PCT/JP2016/076299 (1 page).
(Continued)

*Primary Examiner* — Thai Pham
(74) *Attorney, Agent, or Firm* — Westerman, Hattori, Daniels & Adrian, LLP

(57) ABSTRACT

In frequency control where impedance matching is performed by frequency sweep in an RF power supply device, a frequency sweep direction is specified, allowing a reflection coefficient and/or reflected power to move to a minimum, whereby it is possible to reduce a time length required until detecting the frequency that enables the reflection coefficient and/or the reflected power to be minimized. The frequency control for impedance matching in the RF power supply device is performed according to the following two-stage control; A) phase control that specifies the frequency sweep direction that allows the reflection coefficient (Continued)

and/or the reflected power to move to a minimum, based on the phase state of oscillating frequency, and that starts increasing or decreasing the frequency in thus specified sweep direction; and B) reflected power control where the reflection coefficient or the reflection amount is used as a control end condition for completing the frequency control.

11 Claims, 19 Drawing Sheets

(51) Int. Cl.
  *H03H 7/40* (2006.01)
  *H05H 1/46* (2006.01)

(56) References Cited

U.S. PATENT DOCUMENTS

| | | | |
|---|---|---|---|
| 2003/0178140 A1* | 9/2003 | Hanazaki | H01J 37/32082 156/345.28 |
| 2006/0220573 A1 | 10/2006 | Kotani et al. | |
| 2006/0220656 A1* | 10/2006 | Tanaka | H01J 37/32082 324/600 |
| 2013/0002136 A1 | 1/2013 | Blackburn et al. | |
| 2017/0345621 A1* | 11/2017 | Cheng | H01J 37/32 |

FOREIGN PATENT DOCUMENTS

| | | |
|---|---|---|
| JP | 2006-286254 A | 10/2006 |
| JP | 2006-310245 A | 11/2006 |
| JP | 2010-27587 A | 2/2010 |
| JP | 2013-153432 A | 8/2013 |
| KR | 2006-94913 A | 8/2006 |
| KR | 2013-0077799 A | 7/2013 |
| SG | 191538 A1 | 7/2013 |
| TW | 201327620 A | 7/2013 |
| TW | 201531168 A | 8/2015 |

OTHER PUBLICATIONS

Written Opinion dated Oct. 18, 2016, issued in counterpart application No. PCT/JP2016/076299, w/English translation (9 pages).

Decision of Grant a Patent dated Jun. 2, 2017, issued in counterpart Japanese Patent Application No. 2016-136058, w/English translation (6 pages).

Office Action dated May 22, 2018, issued in counterpart Taiwanese application No. 106112937, with English translation. (15 pages).

Search Report dated Oct. 25, 2018, issued in counterpart Chinese Application No. 2016800728923, with English translation. (2 pages).

* cited by examiner

FIG.10
(a)
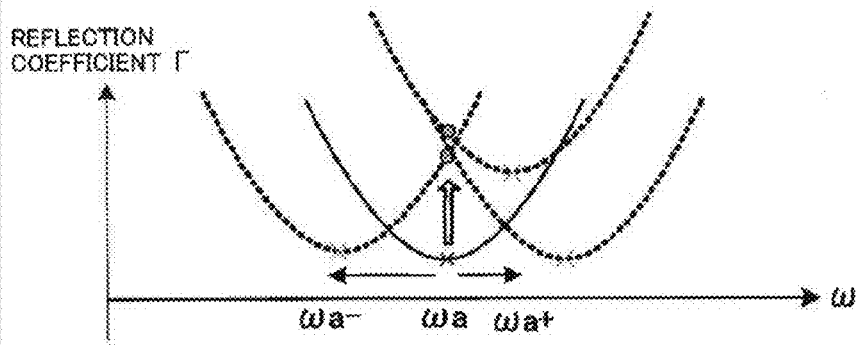
(b)
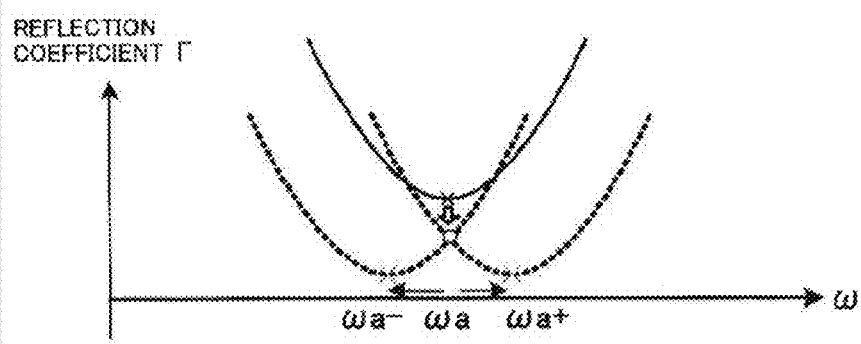

HIGH-FREQUENCY POWER SUPPLY DEVICE, AND CONTROL METHOD FOR HIGH-FREQUENCY POWER SUPPLY DEVICE

TECHNICAL FIELD

The present invention relates to a high-frequency power supply device (an RF power supply device) and to a method of controlling the RF power supply device, and more particularly, it relates to an RF power supply device for supplying power to a load such as a plasma processor intended for use involving electrical discharge; for example, plasma etching and plasma CVD, and to a method of controlling the RF power supply device.

BACKGROUND ART

Variation in the state of electrical discharge of the load may cause fluctuation of impedance. For example, the impedance may fluctuate between before starting discharge and after starting discharge in the plasma load. Also in the course of discharging, the impedance may vary due to the state of gas supplied to the plasma, creations within a plasma chamber, or environmental changes.

It is known that impedance matching is performed by adjusting a matching circuit that is provided between the RF power supply device and the load, so as to supply power efficiently from the RF power supply device to the load. It has been pointed out that the impedance matching according to this matching circuit has a problem, since it is difficult to respond to abrupt impedance variation.

To address this problem, utilizing a feature that an output frequency from an RF power supply device is allowed to be variable instantly, there has been suggested the RF power supply device that changes an output frequency and thereby varying the impedance on the load side, so as to perform impedance matching instantaneously (patent document 1). It has also been suggested that frequency control of the output frequency is performed by changing the frequency, using the absolute value of reflection coefficient as an index (patent documents 1 and 2).

It has been suggested in the patent document 1, a processing is repeated for specifying an oscillation frequency that minimizes the absolute value of the reflection coefficient, along with varying the oscillation frequency within a predetermined frequency range including a reference frequency, thereby controlling the oscillation frequency so that the absolute value of the reflection coefficient becomes smaller.

It has been suggested in the patent document 2, frequency sweep is performed within a defined frequency range, in a constant cycle, so as to detect a frequency that minimizes the reflected power.

It has further been suggested in the patent document 1, in the frequency control after the frequency is specified, there is defined an upper limit of the reflection coefficient in association with the absolute value of the reflection coefficient at that moment, and when the absolute value of the reflection coefficient exceeds the upper limit, the frequency control is repeated again for detecting the oscillation frequency that minimizes the absolute value of the reflection coefficient.

PRIOR ART DOCUMENT

Patent Document

Patent Document 1
Japanese Unexamined Patent Application Publication No. 2006-310245

Patent Document 2
Japanese Unexamined Patent Application Publication No. 2010-27587

DISCLOSURE OF THE INVENTION

Problems to be Solved by the Invention

According to the frequency control conventionally suggested, in the processing for varying the frequency so that the reflection coefficient and/or reflected power is made smaller, the frequency sweep is performed within the predetermined frequency range including the reference frequency, or within a defined frequency range.

When the frequency sweep is performed within the frequency range, there is a possibility that the reflection coefficient and/or the reflected power may increase, depending on the direction for sweeping the frequency. Therefore, it is necessary to perform the frequency sweep in the entire frequency range, causing a problem that a detection time may be prolonged until detecting the frequency that minimizes the reflection coefficient and/or the reflected power.

The present invention is to solve the aforementioned conventional problem, and an object of the present invention is to specify the frequency sweep direction that allows the reflection coefficient and/or the reflected power to move to a minimum, in the frequency control for performing impedance matching according to the frequency sweep in the RF power supply device, thereby reducing a time required until detecting a frequency that minimizes the reflection coefficient and/or the reflected power.

Means for Solving the Problems

The inventors of the present invention have found the following points in frequency control of an RF power supply device:

a) there is a correspondence between a phase property of a reflection coefficient, and a frequency sweep direction that allows the reflection coefficient and/or reflected power to move to a minimum, at a frequency of an output from the RF power supply device; in the aforementioned correspondence, b) when the phase state shows lagging load, the reflection coefficient is in positive phase, and the frequency sweep direction that allows the reflection coefficient and/or the reflected power to move to a minimum indicates a direction where the frequency is increased; and c) when the phase state shows leading load, the reflection coefficient is in negative phase, and the frequency sweep direction that allows the reflection coefficient and/or the reflected power to move to a minimum indicates a direction where the frequency is decreased.

The present invention determines the frequency sweep direction at the time of initiating control, according to whether the phase state shows lagging load or leading load, based on the aforementioned correspondence, and the frequency control for performing impedance matching in the RF power supply device is conducted according to the following two-stage control;

A) phase control that specifies the frequency sweep direction allowing the reflection coefficient and/or the reflected power to move to a minimum, based on the phase state of oscillating frequency, and that starts increasing or decreasing the frequency in thus specified sweep direction; and B) reflected power control that uses a reflection coefficient or a reflection amount, as a control end condition for completing the control of the frequency control.

In the present invention, the frequency control is initiated from the phase control, whereby the frequency sweep direction is specified, allowing the reflection coefficient and/or the reflected power to move to a minimum, and the time required for detecting the frequency that minimizes the reflection coefficient and/or the reflected power is reduced.

The inventors of the present invention have also found that input impedance when viewing the load side from the RF power supply device and the reflection coefficient are provided with similar phase properties. According to the present invention, it is possible to determine the phase state, on the basis of the phase property of the input impedance when the load side is viewed from the RF power supply device, instead of the phase property of the reflection coefficient. When the determination is made on the basis of the phase state of the reflection coefficient, the phase state can be detected from a phase difference between the phase based on voltage and current of a reflected wave, and the phase based on voltage and current of a progressive wave. When the determination is made on the basis of the phase state of the input impedance, it is possible to detect the phase state from a phase difference between voltage and current at an output end of the RF power supply device.

[RF Power Supply Device]

An RF power supply device of the present invention is directed to supplying RF power to a load involving electrical discharge, comprises the following circuit configurations of;

a) an RF generator circuit that generates a variable frequency;

b) a frequency control circuit that outputs a control signal for controlling frequency change in the RF generator circuit;

c) a state-of-reflection detector circuit including a phase detector circuit that detects the phase state of the RF generator circuit, and a reflection arithmetic circuit that computes a reflection coefficient value and/or a reflection amount at an output end of the RF generator circuit, and d) a control-direction command circuit that outputs a direction command signal for providing a control direction where the frequency increases or decreases by the frequency change, on the basis of the phase state outputted from the phase detector circuit.

Among those circuit configurations above, the frequency control circuit, the phase detector circuit, the reflection arithmetic circuit, and the control-direction command circuit may be configured with hardware, and alternatively, they may be configured by software with accompanying elements such as a CPU and a memory.

The frequency control circuit includes two-stage control; phase control and reflected power control, for the RF generator circuit that generates the variable frequency;

A) the phase control is frequency control at the time of initiating the control, and controls increase or decrease of the frequency in the frequency change, on the basis of the direction command signal outputted from the control-direction command circuit; and B) the reflected power control performs control at the time of completing the control, and controls continuing or stopping the frequency change, using as a control end condition, the reflection coefficient value and/or the reflection amount, outputted from the reflection arithmetic circuit.

(Recontrol)

According to the Patent Document 1, the frequency control includes repetition of control (recontrol) where the frequency control is repeated when the absolute value of the reflection coefficient exceeds an upper limit value of the reflection coefficient. In this recontrol, the upper limit value of the reflection coefficient is used as a condition for repeating the control. Therefore, when the reflection coefficient rises, a frequency that allows matching the load-impedance is determined by performing the control again. However, when the reflection coefficient falls, the control is not repeated, and thus it is not possible to determine the frequency that enables matching the load-impedance having varied.

On the other hand, in the present invention, a value corresponding to the reflection coefficient value or the reflection amount defined in the previous frequency control is set as a central value, and a range of the reflection coefficient value or a range of the reflection amount is defined, with a certain width above and below the central value, and this defined range is set as a threshold range, so as to determine variation of the reflection coefficient or of the reflection amount newly obtained. In this determination, when the reflection coefficient or the reflection amount increases or decreases, the frequency control is executed again, so as to obtain a new frequency that allows impedance matching for the load impedance having varied. In this recontrol, it is possible to obtain the frequency that allows impedance matching for the load impedance having varied, not only in the event of increase of the reflection coefficient and/or the reflection amount, but also in the event of decrease thereof.

The RF power supply device of the present invention is provided with a recontrol circuit that outputs a recontrol signal to the frequency control circuit for issuing a command to change the frequency again. The frequency control circuit outputs a control signal to the RF generator circuit according to the recontrol signal. The RF generator circuit generates the variable frequency according to the control signal.

In the recontrol, when the reflection coefficient value and/or the reflection amount obtained in the frequency control of this time exceeds a threshold determined by the reflection coefficient value and/or the reflection amount obtained in the previous frequency control, the frequency control circuit is made to perform another frequency control, allowing the RF generator circuit to generate RF power at the frequency obtained by the frequency control. On the other hand, when the reflection coefficient value and/or the reflection amount obtained in the frequency control of this time is less than the reflection coefficient value and/or the reflection amount obtained in the previous frequency control, the RF generator circuit is allowed to generate RF power at the frequency obtained from the frequency control circuit at the time of completing the previous frequency control.

The recontrol circuit sets as a central value, the reflection coefficient value and/or the reflection amount at the frequency determined according to the frequency change, holds as a threshold range for determining whether or not the recontrol is to be performed, a range of the reflection coefficient and/or a range of the reflection amount, with a certain width above and below the central value, and outputs a recontrol signal in at least either one of the case where the reflection coefficient value detected by a reflection coefficient arithmetic circuit is out of the range of the reflection coefficient, and the case where the reflection amount detected by the reflection arithmetic circuit is out of the range of the reflection amount.

(Modes of Recontrol)

The recontrol circuit is allowed to perform the recontrol in various modes. In the first mode of the recontrol, a recontrol signal is outputted on the basis of variation of the load state. The load state indicates for instance, drive conditions such as drive power and gas pressure generated in a plasma chamber, and operating conditions such as movement of structures within the plasma chamber.

The recontrol circuit outputs the recontrol signal on the basis of variation of the load state. The frequency control circuit is provided with a control end condition in advance, in association with the load state, and in response to the recontrol signal, the frequency control circuit performs reflected power control again, according to the control end condition that is set in advance in association with the load state.

In the second mode of the recontrol, the recontrol signal is outputted, when the reflection coefficient and/or the reflection amount exceeds a preset value continuously for a certain length of time. The frequency control circuit performs the reflected power control again, according to an output of the recontrol signal that is outputted when the reflection coefficient and/or the reflection amount exceeds the preset value continuously for a certain length of time.

(Modes of Phase Detection)

The phase detector circuit in the RF power supply device of the present invention is allowed to detect the phase state in various modes.

In the first mode for detecting the phase state by the phase detector circuit, the phase state is detected according to voltage and current at the output end of the RF generator circuit.

A configuration example of the first mode for detecting the phase state is provided with a voltage detector and a current detector at the output end of the RF generator circuit. The phase detector circuit detects the phase state, on the basis of the voltage detected by the voltage detector and the current detected by the current detector.

In the second mode for detecting the phase state performed by the phase detector circuit, the phase state is detected, according to the phase obtained on the basis of the voltage and current at the output end of the RF generator circuit, and a phase shift due to a transmission line. In the phase detection, a phase to which a component of the phase shift due to the transmission line is added is outputted as the phase state at the output end of the RF generator circuit. By adding the phase shift component due to the transmission line, it is possible to compensate for the phase shift due to the transmission line.

A configuration example where the second mode for detecting the phase state is performed is provided with a direction detector at the output end of the RF generator circuit. The phase detector circuit detects the phase state from a phase difference between the phases based on voltage and current of separated waves, a progressive wave and a reflected wave, obtained by the direction detector.

[Control Method of the RF Power Supply Device]

A control method of the RF power supply device of the present invention is a method for controlling the RF power supply device that supplies RF power to a load involving electrical discharge, wherein frequency control that controls reflected power by impedance matching according to frequency change in the RF power supply device, and the frequency control comprises, A) a phase control step that defines a control direction either increasing or decreasing the frequency due to the frequency change, according to the phase state of the RF power supply device at the time of initiating the control, and B) a reflected power control step that controls continuing/stopping the frequency change, using as the control end condition, the reflection coefficient value and/or the reflection amount of the RF power supply device, in the frequency change where the frequency is increased or decreased as defined in the phase control step.

(Recontrol)

The recontrol sets as a central value, the reflection coefficient value and/or the reflection amount at the frequency determined according to the frequency change, holds as a threshold range for determining whether or not the recontrol is performed, a range of the reflection coefficient and/or a range of the reflection amount, with a certain width above and below the central value, and performs the frequency control again, in at least either one of the case where the reflection coefficient value is out of the range of the reflection coefficient, and the case where the reflection amount is out of the range of the reflection amount.

(Modes of Recontrol)

The recontrol is performed in various modes. In the first mode for performing the recontrol, a recontrol signal is outputted on the basis of variation of the load state. The load state indicates for instance, drive conditions such as drive power and gas pressure generated in a plasma chamber, and operating conditions such as movement of structures within the plasma chamber. A control end condition is prepared in advance, in association with the load state, and reflected power control is performed again, according to the control end condition that is set in advance in association with the load state.

In the second mode for performing the recontrol, the recontrol signal is outputted, when the reflection coefficient and/or the reflection amount exceeds a preset value continuously for a certain length of time. The reflected power control is performed again, according to a recontrol output that is outputted when the reflection coefficient and/or the reflection amount exceeds the preset value continuously for a certain length of time.

(Modes of Phase Detection)

The phase detector circuit in the RF power supply device of the present invention is allowed to detect the phase state in various modes. In the first mode for detecting the phase state by the phase detector circuit, the phase state is detected according to voltage and current at the output end of the RF generator circuit.

In the second mode for detecting the phase state, the phase state is detected according to the phase obtained on the basis of the voltage and current at the output end of the RF generator circuit, and a phase shift due to the transmission line.

As described above, according to the present invention, it is possible to specify the frequency sweep direction that allows the reflection coefficient and/or the reflected power to move to a minimum, in the frequency control for performing impedance matching according to the frequency sweep in the RF power supply device. With this configuration, it is possible to reduce the time required to detect a frequency that minimizes the reflection coefficient and/or the reflected power.

BRIEF DESCRIPTION OF THE DRAWINGS

FIG. 10 illustrates frequency characteristics when the reflection coefficient varies according to the present invention;

BEST MODE FOR CARRYING OUT THE INVENTION

With reference to FIGS. 1 to 19, there will be described an RF power supply device, and a method of controlling the RF power supply device according to the present invention.

Figure 18:
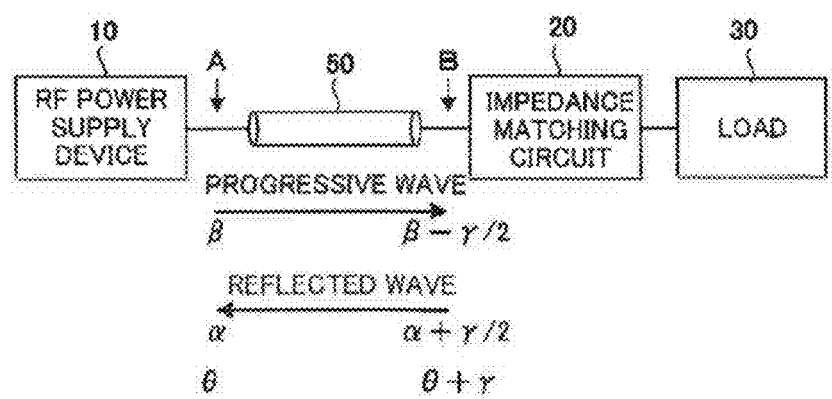
FIG. 18 illustrates phase-shift compensation for compensating for a phase difference caused by a cable that is installed between the RF power supply device and the load according to the present invention.
Figure 19:
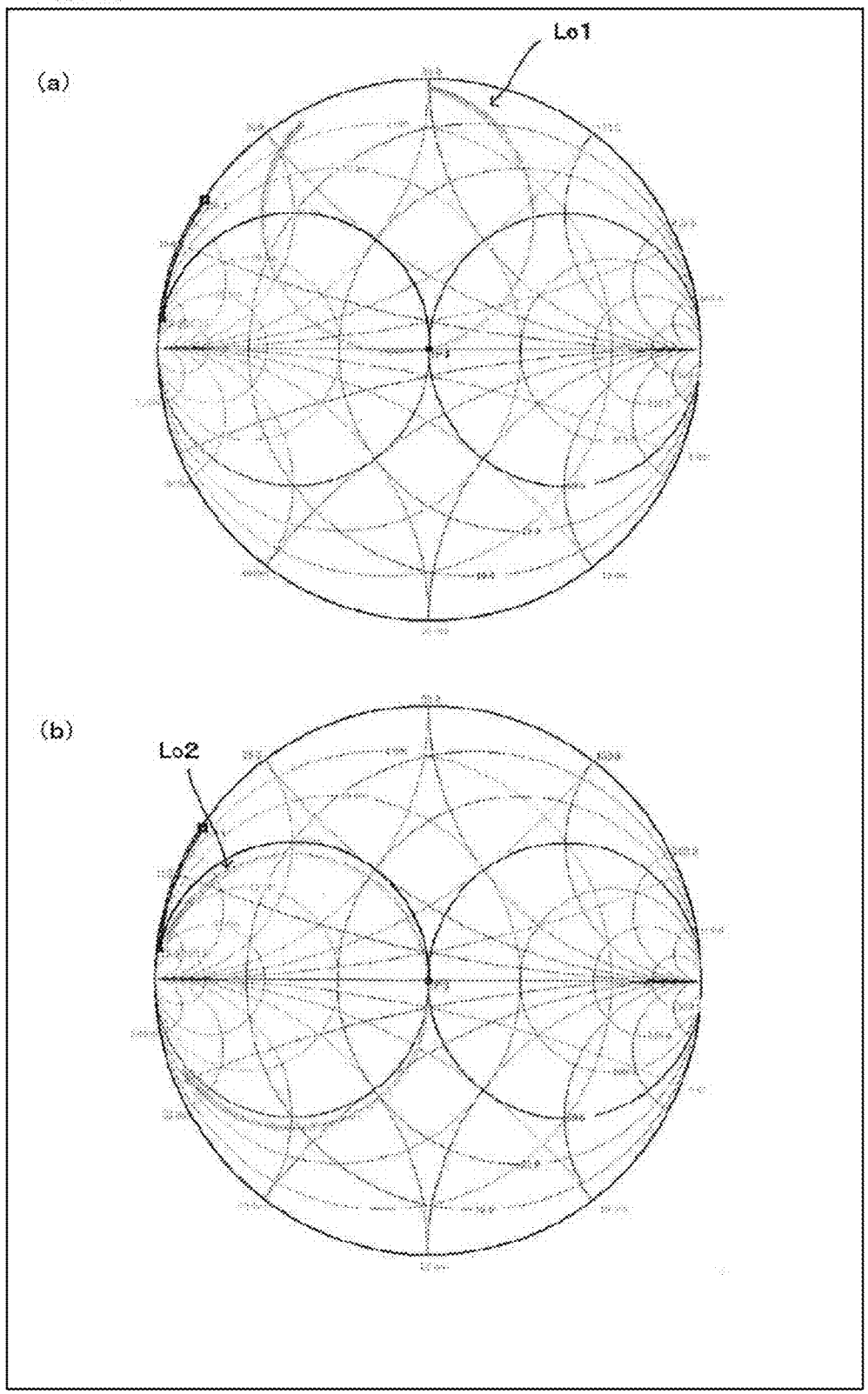
FIG. 19 illustrates compensation for the phase-shift caused by the cable.

Hereinafter, with reference to FIGS. 1 to 3, frequency control of the RF power supply device of the present invention will be described, with reference to FIG. 4, a configuration of the RF power supply device will be described, and with reference to FIGS. 5 to 9 and FIGS. 10 to 17, a method of controlling the RF power supply device will be described. FIGS. 10 to 17 illustrate recontrol according to the RF power supply device of the present invention. With reference to FIGS. 18 and 19, there will be described a method of compensation for a phase difference due to a cable that is installed between the RF power supply device and a load according to the present invention.

(Overview of the Frequency Control in the RF Power Supply Device According to the Present Invention)

Figure 1:
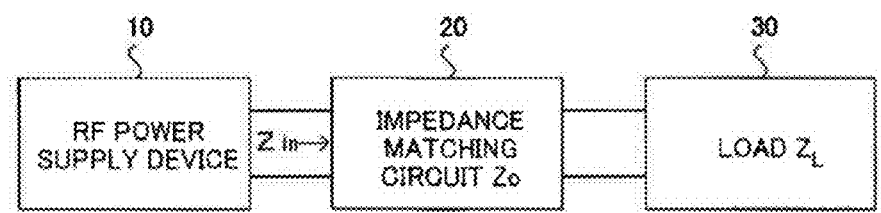
FIG. 1 is a schematic block diagram showing an RF power supply device according to the present invention.
Figure 2:
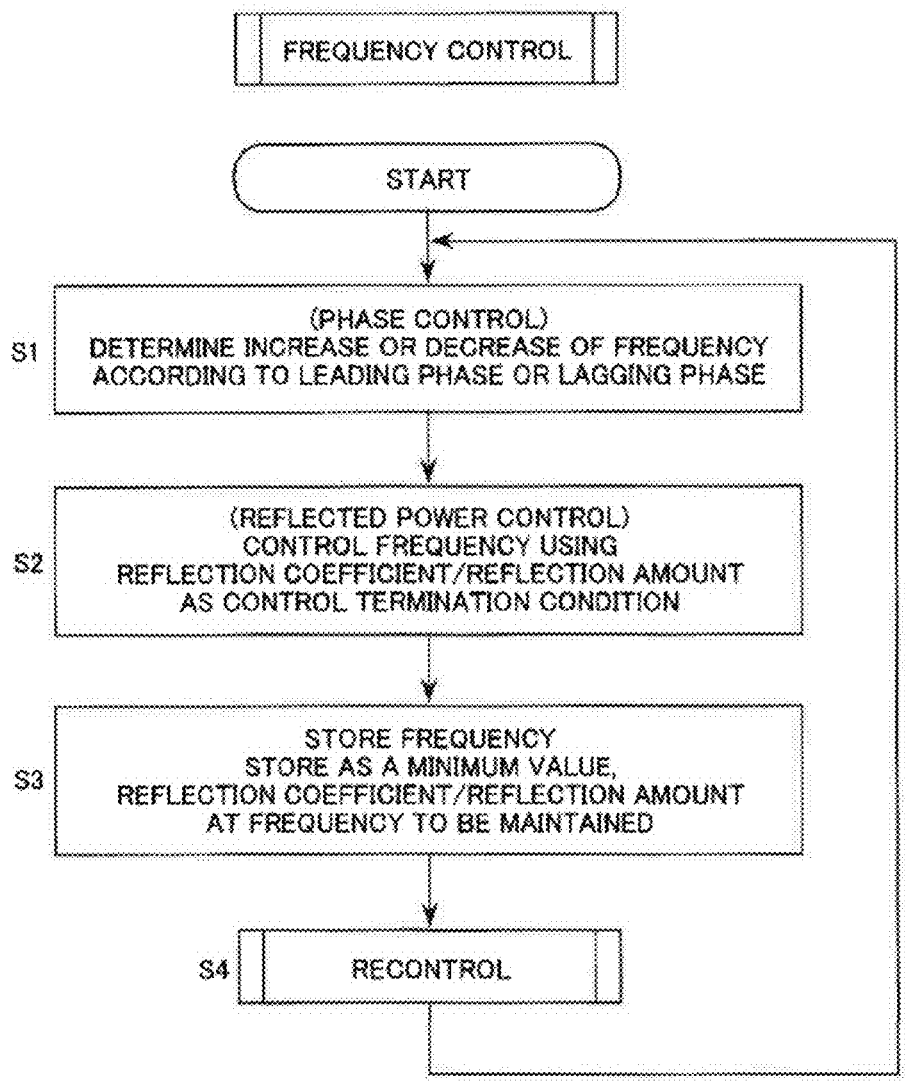
FIG. 2 is a flowchart showing frequency control according to the present invention.
Figure 3:
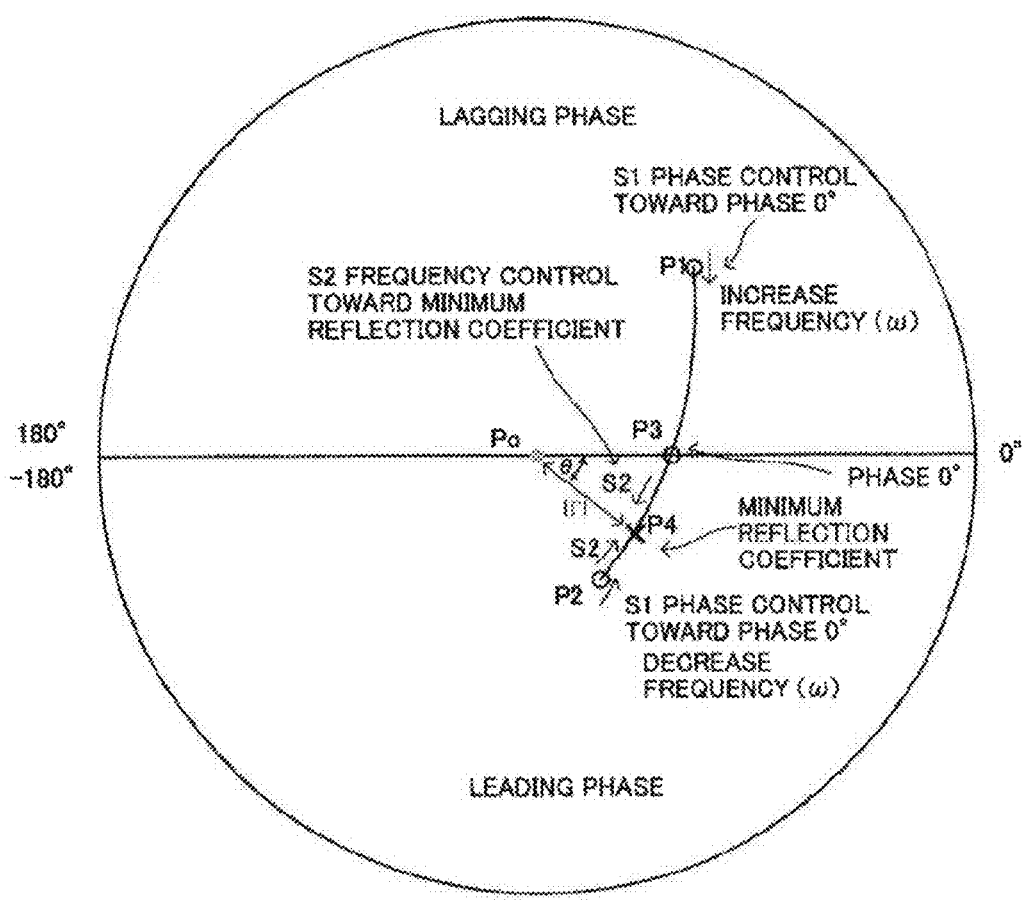
FIG. 3 is a Smith chart showing a reflection coefficient when the frequency control is performed according to the present invention.

With reference to a schematic block diagram of FIG. 1 showing the RF power supply device, a flowchart of FIG. 2 showing the frequency control, and a Smith chart of FIG. 3 showing the reflection coefficient at the time of the frequency control, there will be described a configuration of the RF power supply device and an overview of the frequency control.

(Schematic Configuration of the RF Power Supply Device)

The RF power supply device 10 of the present invention is configured to supply RF power to the load 30 involving electrical discharge, and to perform impedance matching against impedance fluctuation in the load 30, according to frequency control that changes an output frequency from the RF power supply device 10, thereby reducing reflected power returning from the load 30 to the RF power supply device 10, and favorably controlling power supply from the RF power supply device 10 to the load 30.

The impedance matching circuit 20 is provided between the RF power supply device 10 and the load 30, and impedance matching is established with the load 30 in the normal state. When output impedance from the power source is $Z_O$, characteristic impedance of the impedance matching circuit 20 including the impedance of the load 30 is $Z_L$, and the input impedance on the load 30 side viewed from the RF power supply device 10 is $Z_{in}$, the reflection coefficient $\Gamma$ is expressed as $\Gamma=(Z_L-Z_O)/(Z_L+Z_O)$, where impedance is represented as $Z_L$, $Z_O$, and $Z_{in}$ and $\Gamma$ is a function of frequency $\omega$.

The RF power supply device 10 outputs variable radio frequency $\omega$ against fluctuations of the impedance $Z_P$ of the load 30, thereby making each impedance variable, and performing the frequency control to obtain a minimum value of the reflection coefficient $\Gamma$.

(Overview of the Frequency Control)

The frequency control of the present invention performs two control steps in the impedance matching where the outputted radio frequency $\omega$ is variable; a phase control step (S1) upon initiating the control, and a reflected power control step (S2) after starting the control, thereby outputting radio frequency at which reflected power is minimized. The frequency obtained by the frequency control is maintained, along with storing as minimum values the reflection coefficient $\Gamma$ and/or the reflection amount Wr at that time (S3).

In addition, according to the recontrol (S4), two control steps, i.e., the phase control step and the reflected power control step are repeated, thereby maintaining the reflected power to be minimized. The phase control step S1 and reflected power control step S2 perform the control, respectively, as the following.

(Phase Control Step)

The phase control step defines a direction of frequency sweep for increasing or decreasing a frequency in the frequency change, on the basis of the phase state of the RF power supply device, when the control is initiated.

The frequency sweep direction coincides with a direction of frequency changes where the reflection coefficient and/or the reflection amount is reduced in the frequency control. In the phase control step, the sweep direction of the frequency control is defined when the control is initiated, thereby reducing a processing time of the frequency control for reducing the reflected power.

The phase control step defines the frequency sweep direction according to the phase state indicating whether the phase $\varphi$ of the reflection coefficient $\Gamma$ is positive or negative.

The positive phase corresponds to lagging load, and the negative phase corresponds to leading load.

FIG. 3 illustrates the Smith chart showing the reflection coefficient Γ. During impedance matching, it is defined as Γ=Γmin. In particular, when the characteristic impedance $Z_O$ matches the load impedance $Z_p$, the reflection coefficient Γ is "0". The point where the reflection coefficient Γ is "0" corresponds to the center point $P_O$ on the Smith chart. In the Smith chart, an upper area with respect to the central line passing through the center point $P_O$ indicates the positive phase, and the lower area indicates the negative phase. The positive phase corresponds to the lagging phase where current delays relative to voltage, and the negative phase corresponds to the leading phase where current leads voltage.

A locus of the reflection coefficient Γ on the Smith chart moves along with variation of the frequency ω. In the vicinity of the frequency $ω_o$ at the time of impedance matching, when the frequency ω is lower than the frequency $ω_{φ=0}$, with respect to the frequency $ω_{φ=0}$ where the phase φ becomes "0", the reflection coefficient Γ indicates positive phase, and when the frequency ω is higher than the frequency $ω_{φ=0}$, the reflection coefficient Γ indicates negative phase.

A relationship between the aforementioned frequency ω and the phase φ has following phase characteristics, in an ideal situation where Γ=Γmin is established at the time of impedance matching. When the characteristic impedance $Z_L$ and the output impedance $Z_O$ from the power source are represented by parallel connection between a capacitance component C and an inductive component L, at the frequency $ω_0$ where the phase φ=0, a component relating to the phase φ within the reflection coefficient $Γ=(Z_L-Z_O)/(Z_L+Z_O)$ shows the characteristics as the following, when viewed in the coordinate where the x-axis indicates the frequency ω and the y-axis indicates the phase φ; the phase φ becomes "0" at the frequency $ω_{φ=0}$, and the phase becomes positive at the frequency lower than the frequency $ω_{φ=0}$, and the phase becomes negative at the frequency higher than the frequency $ω_{φ=0}$, assuming an upper part of the coordinate as the positive phase.

According to the aforementioned phase characteristics, the locus of the reflection coefficient Γ in the Smith chart as shown in FIG. 3, moves from the positive phase to negative phase when the frequency ω is increased, and moves from the negative phase to positive phase when the frequency ω is decreased.

Therefore, in the phase control step, when the phase state being detected is lagging phase (e.g., the point of $P_1$), the phase of the reflection coefficient Γ is moved in the direction toward 0° (the point of $P_3$) by increasing the frequency ω. On the other hand, when the detected phase state is leading phase (e.g., the point of $P_2$), the phase of the reflection coefficient Γ is moved in the direction toward 0° (the point of $P_3$) by decreasing the frequency ω. In FIG. 3, the position where the phase is 0° is indicated by the circle of point $P_3$.

Since the phase of the reflection coefficient Γ and the phase of the impedance $Z_{in}$ when viewing the load side from the RF power supply device side, have the same phase characteristics, it is possible to detect the phase state of the reflection coefficient, by detecting the phase state at the output end of the RF power supply device. The phase state at the output end of the RF power supply device path, i.e., the phase state at the input end of the impedance matching circuit, can be obtained according to a phase relationship between voltage and current at the output end of the RF power supply device, or according to a phase difference between the phase of the reflected wave and the phase of the progressive wave at the output end of the RF power supply device.

(Reflected Power Control Step)

A target of the frequency control is to obtain the absolute value |Γ| of the reflection coefficient which is minimum, but even when the absolute value |Γ| of the reflection coefficient Γ is at the point where the phase φ is 0° (the point of $P_3$ in FIG. 3), the value is not necessarily minimum.

In the Smith chart of FIG. 3, the point P4 where the absolute value |Γ| of the reflection coefficient Γ becomes minimum is indicated by x, and this position is different from the point $P_3$ where the phase φ is 0°. In view of this, firstly, frequency sweep is started towards the position (point $P_3$) where the phase φ of the reflection coefficient Γ is 0° according the phase control step, and thereafter, according to the reflected power control, the frequency is controlled so that the absolute value |Γ| of the reflection coefficient is minimized.

In the reflected power control step S2, after the frequency change is started in the sweep direction as defined in the phase control step S1, continuing/stopping the frequency change is controlled, using a reflection coefficient value and/or a reflection amount as a control end condition. In the example here, as the control end condition, it is utilized that the reflection coefficient value and/or the reflection amount of the RF power supply device can be minimized by controlling the frequency change, and accordingly, it is possible to determine whether or not the reflection coefficient Γ or the reflection amount is minimum.

In FIG. 3, when a start point of the frequency control is in positive phase, after the frequency is controlled to increase to approach the phase 0° according the frequency control in the phase control step, a frequency that minimizes the reflection coefficient Γ or the reflection amount is obtained by the reflected power control. In the case where the start point of the frequency control is in negative phase, after the frequency is controlled to decrease to approach the phase 0° according the frequency control in the phase control step, a frequency that minimizes the reflection coefficient Γ or the reflection amount is obtained by the reflected power control.

(Recontrol Step)

While maintaining the frequency obtained in the phase control step and the reflected power control step, an output is supplied to the load (S3). Subsequently, any variation on the load, or the like, may bring the impedance matching out of a proper state. In this case, according to the recontrol step S4, the phase control step S1 and the reflected power control step S2 are repeated, and an appropriate frequency ω is obtained, so as to perform impedance matching. In the recontrol step (S4), the reflection coefficient and the reflection amount at the frequency obtained in the phase control step and in the reflected power control step are stored as minimum values, and when the reflection coefficient and the reflection amount obtained later exceed thresholds, the recontrol is performed.

(Configuration of RF Power Supply Device of the Present Invention)

Figure 4:
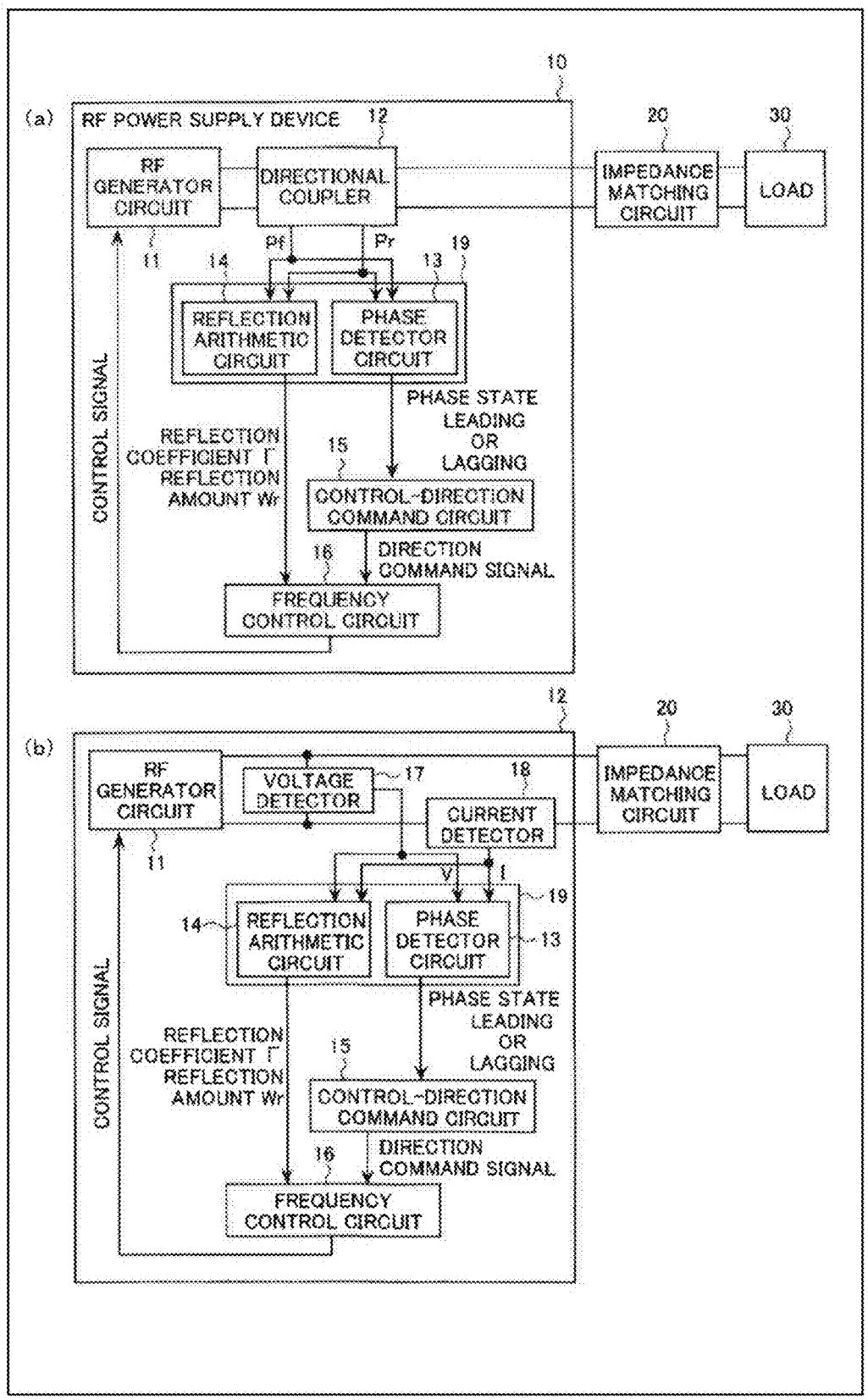
FIG. 4 illustrates a schematic configuration of the RF power supply device according to the present invention.

FIG. 4 illustrates a schematic configuration of the RF power supply device of the present invention. The configuration as shown in FIG. 4(a) is different from that of FIG. 4(b) in the configuration of phase detection, and they are identical in the other configuration.

The RF power supply device 10 is provided with an RF generator circuit 11 for generating radio frequency, a directional coupler 12, a phase detector circuit 13, a reflection arithmetic circuit 14, a control-direction command circuit 15, and a frequency control circuit 16. The phase detector circuit 13 and the reflection arithmetic circuit 14 constitute a state-of-reflection detector circuit 19.

The RF generator circuit 11 supplies a radio frequency output being generated, from the directional coupler 12 to the load 30 via the impedance matching circuit 20. The directional coupler 12 separates traveling wave power Pf directed to the load 30 from the RF generator circuit 11, and reflected power Pr returning from the load 30 to the RF generator circuit 11.

The phase detector circuit 13 detects the reflection coefficient and the phase state, on the basis of the traveling wave power Pf and the reflected power Pr being separated in the directional coupler 12, or on the basis of the voltage V and the current I respectively obtained in the voltage detector 17 and the current detector 18. FIG. 4(*b*) illustrates a configuration where the reflection coefficient and the phase state are detected on the basis of the voltage obtained in the voltage detector 17 and the current obtained in the current detector 18.

The control-direction command circuit 15 outputs to the frequency control circuit 16, a direction command signal to issue a command of a frequency sweep direction, on the basis of the phase state detected by the phase detector circuit 13; lagging phase or leading phase.

The reflection arithmetic circuit 14 obtains the reflection coefficient $\Gamma$ or the reflection amount Wr, on the basis of the traveling wave power Pf and the reflected power Pr separated in the directional coupler 12, or on the basis of the voltage and current obtained in the voltage detector 17 and the current detector 18.

The frequency control circuit 16 determines the sweep direction for the frequency change on the basis of the direction command signal, and also performs frequency control for obtaining a frequency that minimizes the reflection coefficient $\Gamma$ or the reflection amount Wr from the reflection arithmetic circuit 14, and outputs thus obtained frequency to the RF generator circuit 11.

(Frequency Control Method of RF Power Supply Device of the Present Invention)

Figure 5:
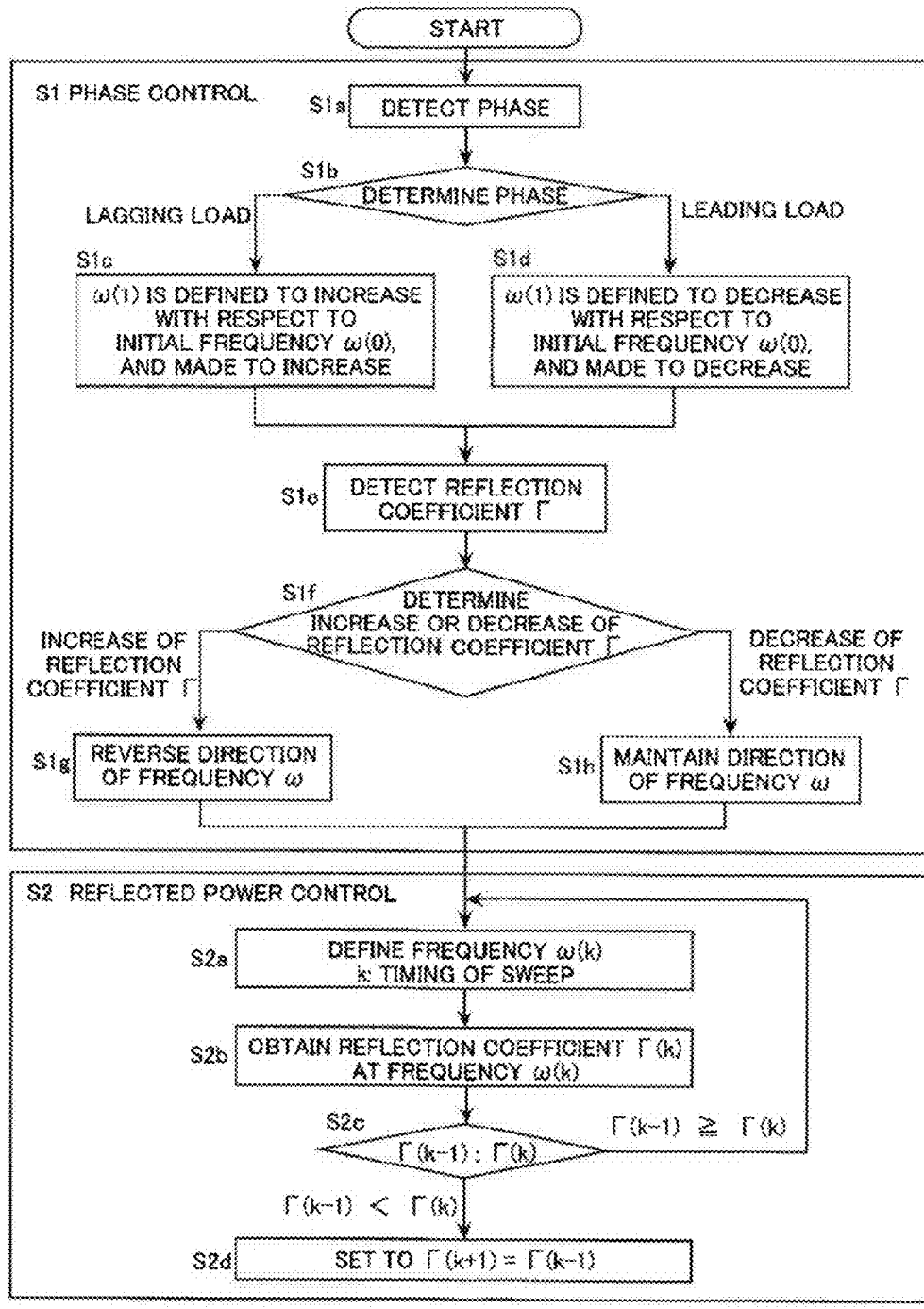
FIG. 5 is a flowchart illustrating one example of a phase control step and a reflected power control step S2 of the present invention.

With reference to FIGS. 5 to 9, the frequency control method will be described. FIG. 5 shows one example of the phase control step S1 and the reflected power control step S2.

In the phase control step, the phase state is detected from the phases of voltage and current at the output end of the RF power supply device, or a phase difference between the reflected wave phase and the progressive wave phase at the output end of the RF power supply device (S1*a*), and it is determined whether thus detected phase state is positive or negative (S1*b*).

In the case where the phase state is positive, it is determined as lagging load, and the frequency sweep for increasing frequency $\omega$ is performed. Then, the frequency $\omega$ is raised relative to the initial frequency $\omega$ (0) and the frequency $\omega$ (1) is determined (S1*c*). In the case where the phase state is negative, it is determined as leading load, and the frequency sweep for decreasing the frequency $\omega$ is performed. Then, the frequency $\omega$ is lowered relative to the initial frequency $\omega$ (0), and the frequency $\omega$ (1) is determined (S1*d*).

The frequency is increased or decreased on the basis of the frequency sweep direction as defined in the phase control step, and then, the reflected power control (S2) is performed. In the reflected power control step as shown in FIG. 5, the reflected power coefficient is illustrated.

In the phase control S1, depending on the state of the load, there may occur an inverse relationship between the phase state and the frequency sweep direction, unlike the relationship described above. In this case, the sweep direction is reversed through the steps S1*e* to S1*h*.

The frequency is made to vary in the sweep direction as defined in the step S1*c* or S1*d*, and the reflection coefficient $\Gamma$ or the reflection amount Wr is detected (S1*e*). Then, it is judged whether the reflection coefficient $\Gamma$ or the reflection amount Wr has increased or decreased (S1*f*). If the reflection coefficient $\Gamma$ or the reflection amount Wr increased, it is determined that the sweep direction has been opposite, and inverse control is performed for reversing the sweep direction of the frequency $\omega$ (S1*g*). On the other hand, if the reflection coefficient $\Gamma$ or the reflection amount Wr decreased, it is determined that the sweep direction has been a proper direction, and the control is performed with maintaining the sweep direction of the frequency $\omega$ (S1*h*).

In the reflected power control (S2) that is performed subsequent to the phase control step (S1), the frequency sweep is performed (S2*a*) at the timing (sampling) k, with varying the frequency $\omega$ (k), and the reflection coefficient $\Gamma$ (k) is obtained (S2*b*) at the frequency $\omega$ (k) at the timing k of each sampling.

The reflection coefficient $\Gamma$ (k−1) obtained at the timing (k−1) is compared with the reflection coefficient $\Gamma$ (k) obtained at the timing (k). In the case where $\Gamma$ (k) obtained by the latter sampling (k) is equal to or smaller than $\Gamma$ (k−1) obtained one sampling before ($\Gamma$ (k−1)≥$\Gamma$ (k)), it is determined that much smaller reflection coefficient $\Gamma$ may be obtained by continuing the frequency sweep, and thus the steps S2*a* and S2*b* are repeated.

On the other hand, in the case where $\Gamma$ (k) obtained by the latter sampling (k) exceeds $\Gamma$ (k−1) obtained one sampling before ($\Gamma$ (k−1)<$\Gamma$ (k)), it is determined that the reflection coefficient $\Gamma$ may become larger by continuing the frequency sweep, and then the control is completed, by setting as $\Gamma$ (k+1)=$\Gamma$ (k−1) at the next sampling (k+1).

Figure 6:
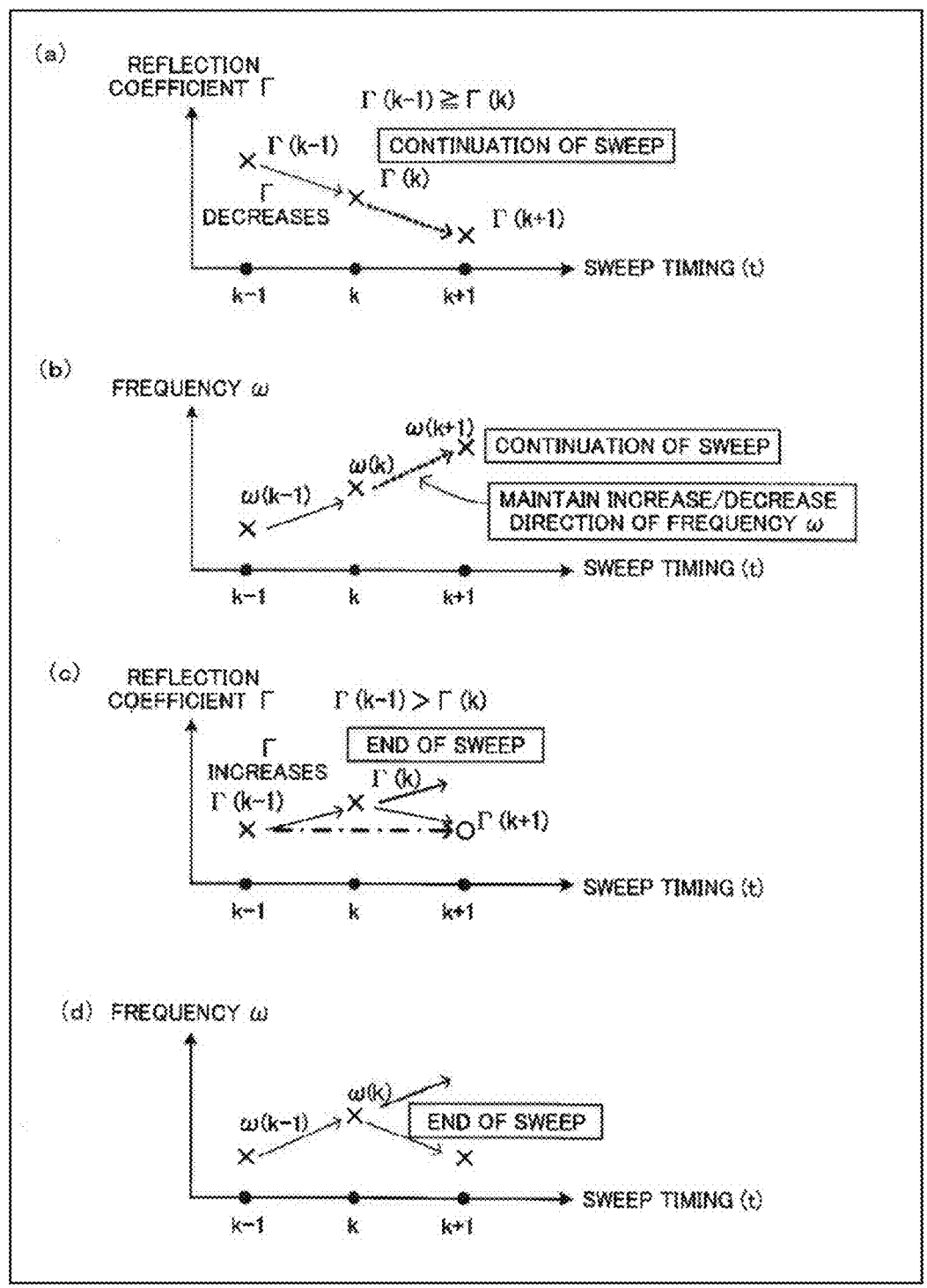
FIG. 6 illustrates a frequency sweep of the present invention.

FIG. 6 illustrates the frequency sweep in the reflected power control, FIGS. 6(*a*) and 6 (*b*) show the situation where the frequency sweep is continued, and FIGS. 6(*c*) and 6(*d*) show the situation that the frequency sweep is stopped to complete the frequency control. In here, there is shown the case where the frequency $\omega$ is increased, but it is also applicable to the case where the frequency $\omega$ is decreased.

When the frequency sweep is continued as shown in FIGS. 6(*a*) and 6 (*b*), this situation corresponds to the case where $\Gamma$ (k−1)≥$\Gamma$ (k) in the step S2*c*. In this case, according to the comparison between the reflection coefficient $\Gamma$ (k−1) at the sampling (k−1) and the reflection coefficient $\Gamma$ (k) at the sampling (k), it is determined that a smaller reflection coefficient $\Gamma$ may be obtained by continuing the frequency sweep, and the frequency sweep is further continued.

When the frequency sweep is continued as shown in FIGS. 6(*c*) and 6 (*d*), this situation corresponds to the case where $\Gamma$ (k−1)<$\Gamma$ (k) in the step S2*c*. In this case, according to the comparison between the reflection coefficient $\Gamma$ (k−1) at the sampling (k−1) and the reflection coefficient $\Gamma$ (k) at the sampling (k), it is determined that the reflection coefficient $\Gamma$ may be larger by continuing the frequency sweep, and thus the frequency sweep is stopped.

(Phase Characteristics when the Reflection Coefficient $\Gamma$ is in the Vicinity of "0")

Next, phase characteristics when the reflection coefficient $\Gamma$ is in the vicinity of "0" will be described. In the phase control, the frequency sweep is performed in the direction indicating; when the phase state is positive and lagging load, the frequency is increased, and when the phase state is negative and leading load, the frequency is decreased. This relationship between the phase state and the sweep direction is caused by the phase frequency characteristics of the reflection coefficient Γ.

The phase frequency characteristics of the reflection coefficient Γ are represented by the frequency characteristics of the imaginary part in the reflection coefficient Γ ($=(Z_L-Z_O)/(Z_L+Z_O)$). When the imaginary part of the reflection coefficient Γ ($=(Z_L-Z_O)/(Z_L+Z_O)$) is compared with the imaginary part of the input impedance $Z_{in}$ when viewing the load side from the RF power supply device, they have the same characteristics in a relationship between a capacitance component and an inductive component. According to this relationship, the frequency characteristics of the phase of the reflection coefficient Γ can be obtained from the frequency characteristics of the imaginary part of the reflection coefficient Γ.

Figure 7:
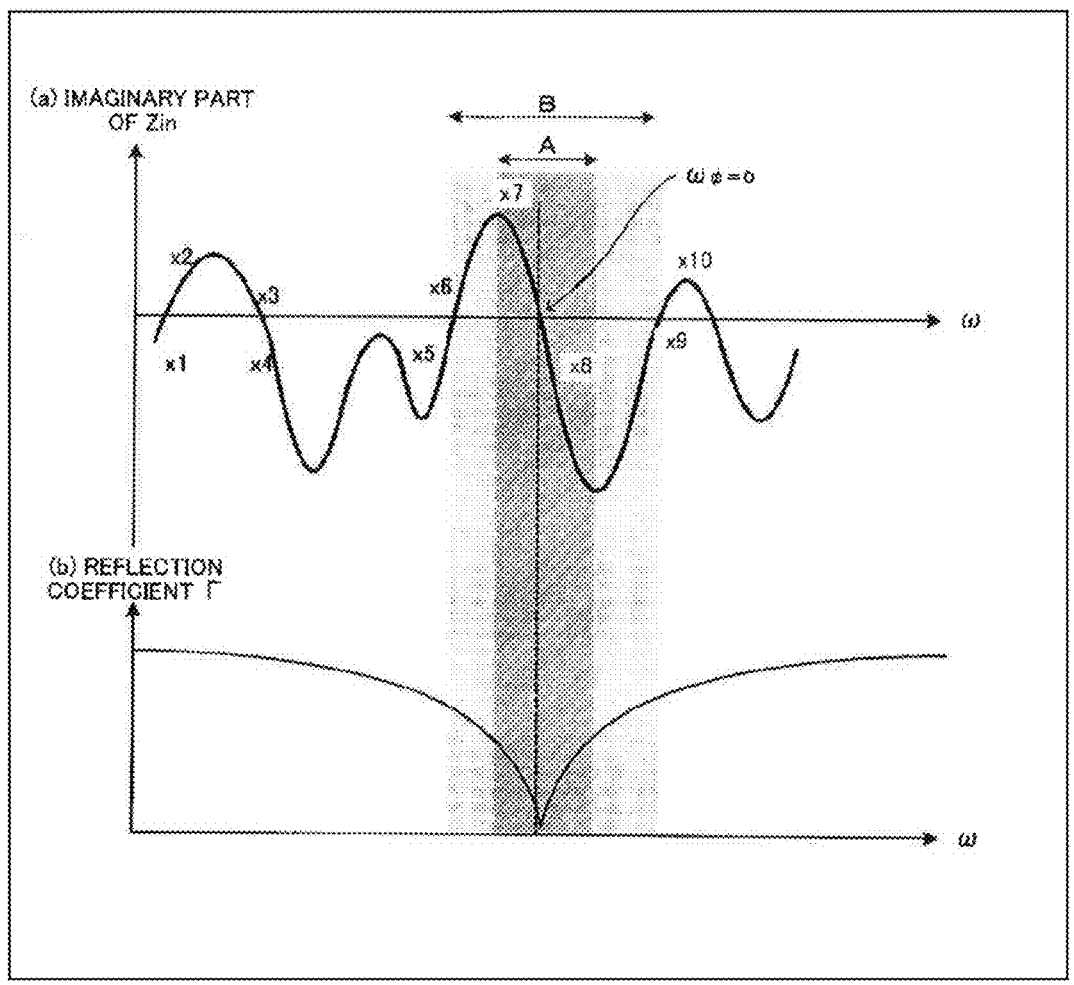
FIG. 7 schematically illustrates frequency characteristics of an imaginary part of input impedance $Z_{in}$ and frequency characteristics of the reflection coefficient $\Gamma$ according to the present invention.

FIG. 7 schematically illustrates the frequency characteristics of the imaginary part of the input impedance $Z_{in}$ (FIG. 7(a)), and the frequency characteristics of the reflection coefficient Γ (FIG. 7(b)). It should be noted that $Z_O$ indicates characteristic impedance 50Ω, in general.

In the frequency range where the reflection coefficient Γ is in the vicinity of "0", the phase of the imaginary part of $Z_{in}$ is positive in the low frequency range, whereas it is negative in the high frequency range, on both sides of the frequency $\omega_{\varphi=0}$ where the phase becomes "0". In FIGS. 7(a) and 7(b), the hatched area A indicates the frequency range where Γmin exists, around the frequency $\omega_{\varphi=0}$ on the phase characteristics curve. The solid pattern range B indicates the frequency range put between the two points where the two phases around the frequency $\omega_{\varphi=0}$ become zero on the phase characteristics curve. Assuming the frequencies within those areas A and B as the frequencies where the reflection coefficient Γ is in the vicinity of "0", when the frequency sweep is started from the frequency in the positive phase, the phase varies towards the state where the phase is "0", by increasing the frequency. On the other hand, when the frequency sweep is started from the frequency in the negative phase, the phase varies towards the state where the phase is "0", by decreasing the frequency.

The frequency characteristics of the imaginary part of the phase input impedance $Z_{in}$ indicate that the phase may become "0" at various frequencies. However, in the frequency area where the reflection coefficient Γ becomes in the vicinity of "0", the sweep is performed in the direction where the frequency is increased when the phase state is positive and lagging load, and when the phase state is negative and leading load, the sweep is performed in the direction where the frequency is decreased, thereby rendering the reflection coefficient Γ to be minimum. It is to be noted that since the phase frequency characteristics of the impedance matching circuit depend on a circuit configuration, the control direction is defined according to the frequency characteristics of the phase.

Figure 8:
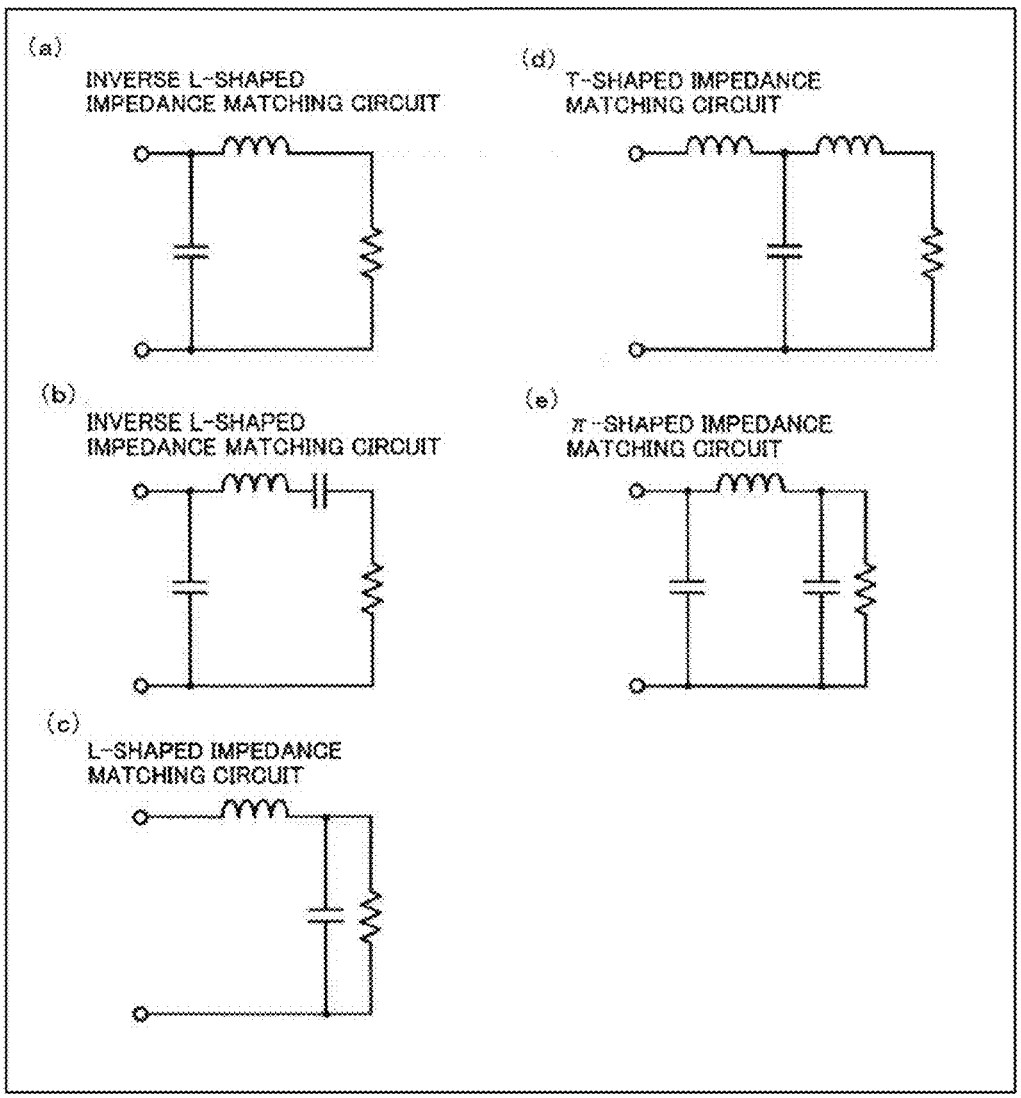
FIG. 8 illustrates impedance matching circuits.

With reference to FIG. 8, there will be described an example of the phase control in the frequency sweep direction, and when the phase state is positive and lagging load, the frequency is increased, whereas when the phase state is negative and leading load, the frequency is decreased.

FIG. 8 illustrates examples of the impedance matching circuit. FIGS. 8(a) to 8(e) illustrate, respectively, examples of an inverse L-shaped impedance matching circuit, a circuit that connects capacity $C_M$ in series with the inverse L-shaped impedance matching circuit, an L-shaped impedance matching circuit, a T-shaped impedance matching circuit, and a π-shaped impedance matching circuit.

According to the circuit example of the inverse L-shaped impedance matching circuit as shown in FIG. 8(a), the load impedance $Z_{in}$ and the phase φ of the load impedance are expressed by the following formulas 1 and 2.

$$Zin = \frac{R + j\omega L}{R + j\omega L + 1/j\omega C} = \frac{R^2 + (\omega L)^2}{R + j\omega(CR^2 + \omega^2 CL^2 - L)} = \frac{[R^2 + (\omega L)^2][R - j\omega(CR^2 + \omega^2 CL^2 - L)]}{R^2 + \omega^2(CR^2 + \omega CL^2 - L)^2} \quad (1)$$

$$\phi = \tan^{-1}\left[-\frac{\omega(CR^2 + \omega^2 CL^2 - L)}{R}\right] = \tan^{-1}\left[\frac{\omega(-\omega^2 CL^2 - CR^2 + L)}{R}\right] \quad (2)$$

In the control for directing the phase φ toward zero, in the case where ω is a positive real number and C, L, and R of the matching circuit satisfy the matching condition of $(L-CR^2)>0$, the frequency is raised since lagging load is found with respect to the current in the state of $(-\omega^2 CL^2 - CR^2 L)>0$ in the formula 2. On the other hand, the frequency is lowered since leading load is found with respect to the current in the state of $(-\omega^2 CL^2 - CR^2 + L)<0$.

According to the circuit example as shown in FIG. 8(b), where the capacity $C_M$ is connected in series with the inverse L-shaped impedance matching circuit, the load impedance $Z_{in}$ and the phases φ of the load impedance are expressed by the following formulas 3 and 4. This circuit example represents the frequency characteristics closer to a real circuit, rather than the inverse L-shaped impedance matching circuit as shown in FIG. 8(a).

$$Zin = \frac{(R + j\omega L + 1/j\omega C_M) \times 1/j\omega C_T}{R + j\omega L + 1/j\omega C_M + 1/j\omega C_T} = \frac{\omega C_M R + j\omega^2 C_M L - j}{\omega(C_M + C_T) - \omega^3 LC_M C_T + j\omega^2 C_M C_T R} = \frac{[\omega C_M R + j(\omega^2 C_M L - 1)][\omega(C_M + C_T) - \omega^3 LC_M C_T - j\omega^2 C_M C_T R]}{[\omega(C_M + C_T) - \omega^3 LC_M C_T]^2 + (\omega^2 C_M C_T R)^2} \quad (3)$$

$$\phi = \tan^{-1}\left[\frac{p(\omega)}{\omega^2 C_M^2 R}\right] = \tan^{-1}\left[\frac{P(\omega)}{\omega C_M^2 R}\right] \quad (4)$$

In the formula 4, P(ω) is the imaginary part of the numerator of $Z_{in}$ that is expressed by the formula 3, and p(ω) represents P(ω)/ω, i.e., P(ω) is divided by ω. Here, p(ω) in the phase φ is a convex upward function with respect to $\omega^2$, and it is also the convex upward function with respect to ω for the real numbers where ω>0, and a maximum value of p(ω) is non-negative value. This indicates that $Z_{in}$ is lagging load and the current phase is negative.

Here, p(ω) has one inflection point, and a phase operation mode is reversed at the inflection point. Under the condition that ω is a positive real number, if p(ω)>0, it is lagging load with respect to current, and thus the frequency is raised, whereas if p(ω)<0, it is leading load with respect to current, the frequency is lowered and the phase is controlled to move toward zero.

Accordingly, the current phase becomes zero when the frequency $\omega_{\varphi=0}$ where the phase φ is zero, and in the case where the frequency ω indicates $\omega>\omega_{\varphi=0}$, the phase becomes leading phase. When the frequency ω indicates $ω<ω_{φ=0}$, the phase becomes lagging phase.

As described above, in the frequency sweep direction of in the phase control, when the phase state is positive and lagging load, the frequency is directed to increase, whereas when the phase state is negative and leading load, the frequency is directed to decrease.

Specific formulas for the other impedance matching circuits as shown in FIGS. 8(c) to 8(e) will not be shown, but there are provided $Z_{in}$ and φ in association with each circuit configuration.

(Example of Polar Coordinates for Displaying Reflection Coefficient and Phase)

Figure 9:
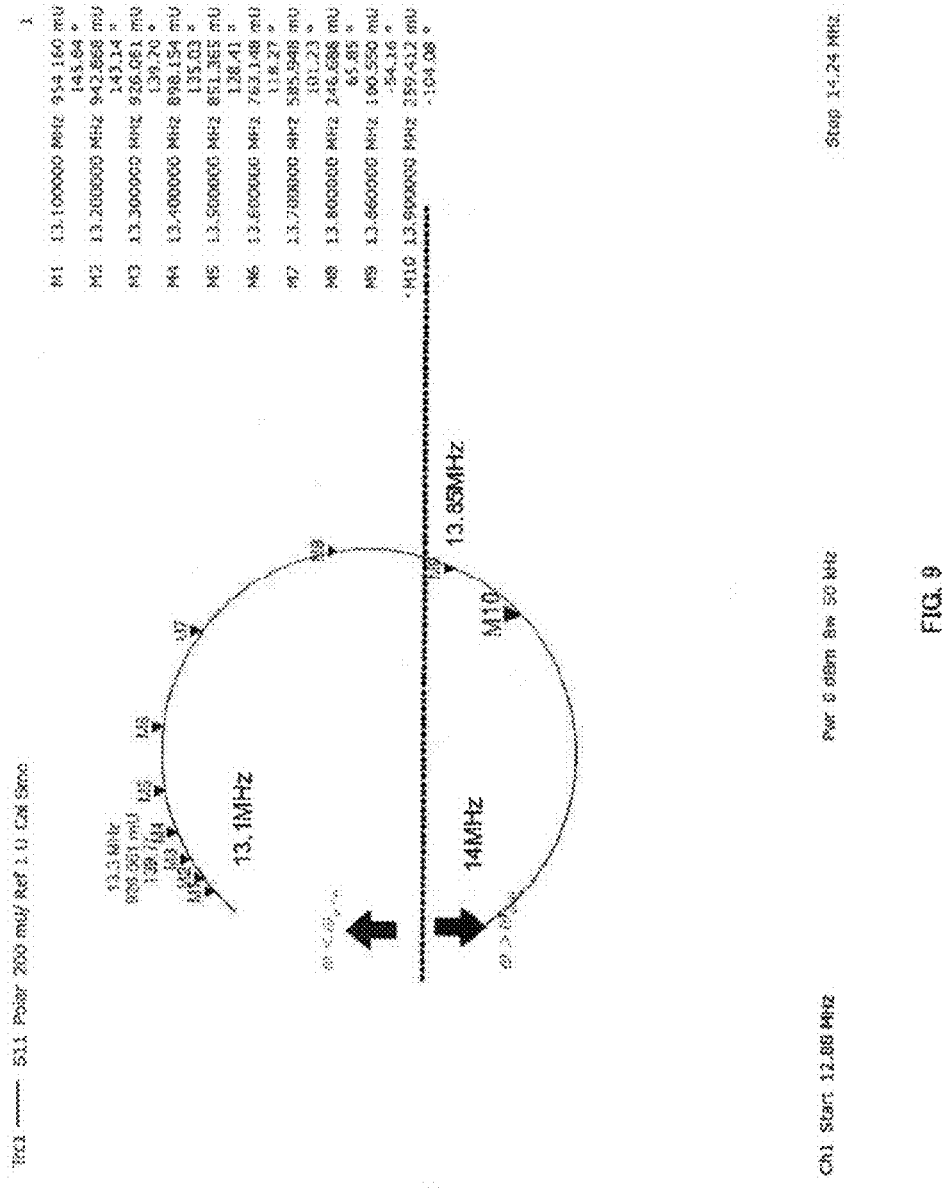
FIG. 9 illustrates one example of the Smith chart showing the reflection coefficient and phase in polar coordinates when the frequency sweep is performed according to the present invention.

FIG. 9 shows one example of the Smith chart displaying by polar coordinates, a reflection coefficient and a phase when the frequency sweep is performed.

In the figure, the broken line indicates the phase φ is 0°. Assuming the frequency indicates $ω_{φ=0}$ when the phase φ=0°, the frequency ω in the area upper than the broken line is lower than $ω_{φ=0}$, and the frequency ω in the area lower than the broken line is higher than $ω_{φ=0}$. The arc in the figure represents the locus of the reflection coefficient Γ when the frequency ω is made to vary. This arc-shaped locus of the reflection coefficient Γ starts moving from a point on the locus in the area upper than the broken line, when the frequency sweep is started from a frequency lower than $ω_{φ=0}$, passes through the broken line where the phase φ=0° at $ω_{φ=0}$, and then moves into the area lower than the broken line.

In the illustrated example, the phase indicates φ=0° at the frequency of 13.85 MH. The reflection coefficient F is not necessarily minimized at the frequency $ω_{φ=0}$ when the phase φ becomes 0°, but the reflection coefficient Γ is minimized at the frequency indicated by M9 that goes over the frequency $ω_{φ=0}$ in the figure.

(Recontrol in RF Power Supply Device According to the Present Invention)

With reference to FIGS. 10 to 17, there will be described the recontrol in the RF power supply device according to the present invention.

The reflection coefficient may vary depending on the state of the load, after the reflection coefficient value is minimized by the frequency control. FIG. 10 illustrates the frequency characteristics when the reflection coefficient fluctuates. In FIG. 10, the solid line indicates the frequency characteristics of the reflection coefficient Γ when the frequency control is performed, and the broken lines indicate the frequency characteristics of the reflection coefficient Γ after variations of the load state. The x-mark indicates a minimum value of the reflection coefficient Γ before the variations of the load state in each of the frequency characteristics, and $ω_a$, $ω_{a+}$, and $ω_{a-}$ represent examples of the frequency ω in the frequency characteristics when the reflection coefficient is minimized after the variations of each load state. The circle indicates a value of the reflection coefficient after the variations.

Figure 11:
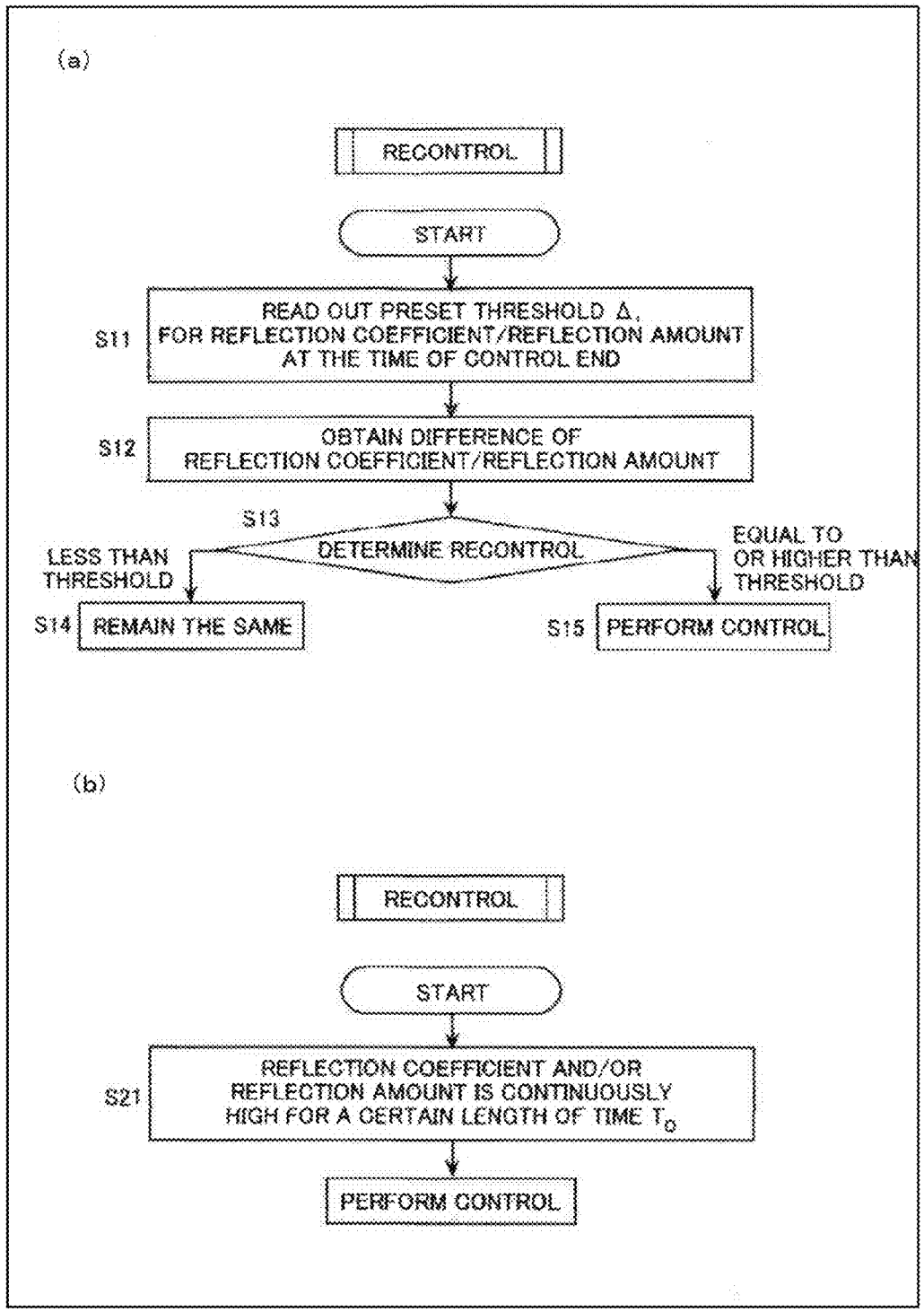
FIG. 11 shows flowcharts illustrating an aspect of recontrol where the frequency control is performed again.
Figure 12:
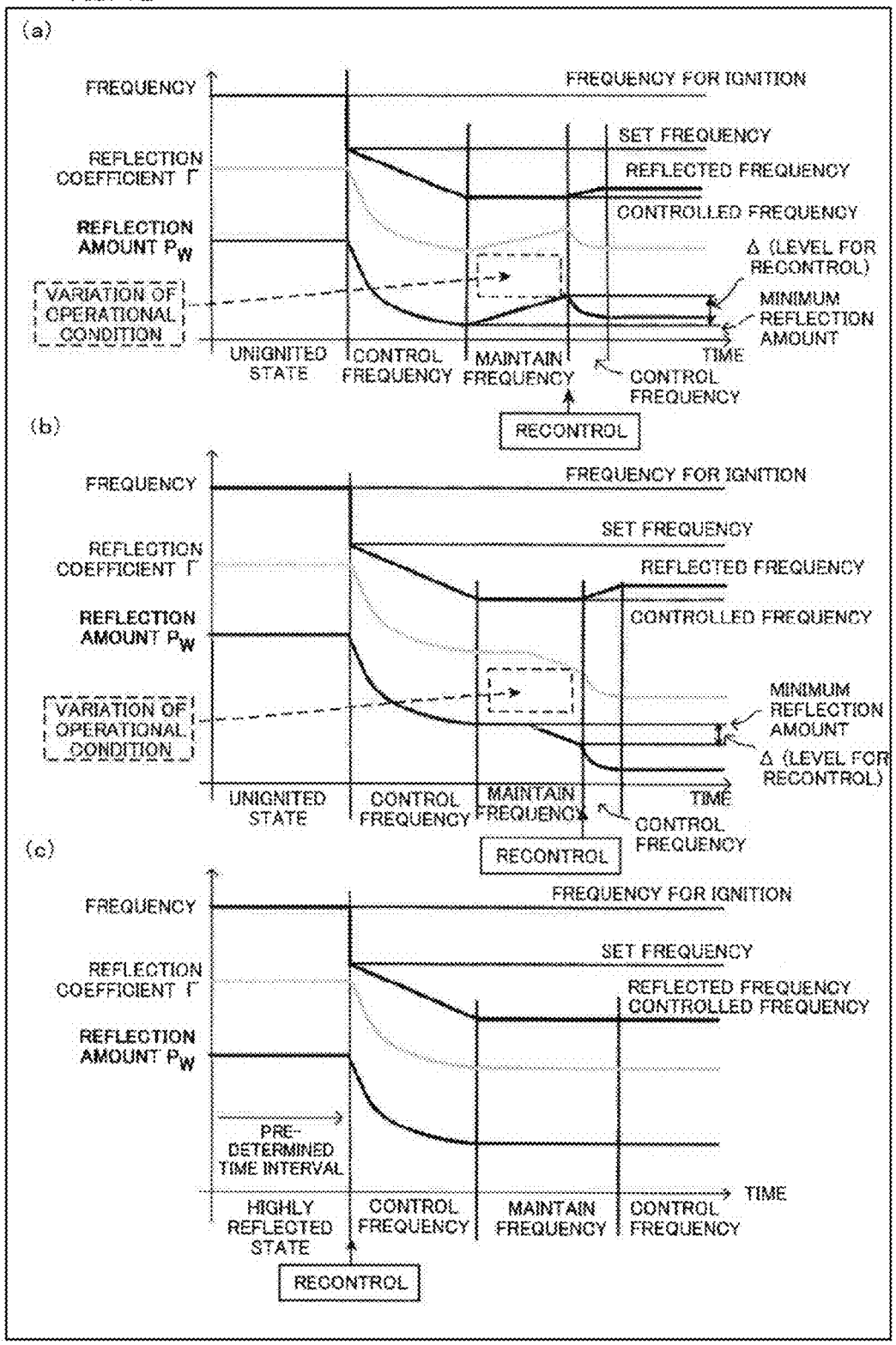
FIG. 12 illustrates aspects of recontrol where the frequency control is performed again according to the present invention.

FIG. 10 illustrates variations of the reflection coefficient value, and FIG. 11 illustrates modes of the recontrol for performing the frequency control again.

FIG. 10(a) illustrates the case where the reflection coefficient value rises after the frequency is controlled. The reflection coefficient value rises when the frequency characteristics of the reflection coefficient value move in the positive direction of the reflection coefficient, and in addition, it rises when the frequency characteristics move in the positive or negative directions of the frequency.

When the reflection coefficient value rises, the frequency control is performed again according to the recontrol, so as to establish the frequency ω that minimizes the reflection coefficient value. FIG. 11(a) illustrates a mode of the recontrol conventionally performed. After establishing the frequency $ω_1$ that minimizes the reflection coefficient value according to the frequency control, if the reflection coefficient value rises, the frequency control is performed again by the recontrol, so as to obtain the frequency $ω_2$ that minimizes the reflection coefficient value, and then RF power is supplied according to thus obtained frequency $ω_2$.

Variation of the reflection coefficient value includes a rise as described above, and also a fall of the value. FIG. 10(b) illustrates one example where the reflection coefficient value falls. The frequency characteristics of the reflection coefficient after the variation as indicated by the broken lines, are located lower than the frequency characteristics of the reflection coefficient indicated by the solid line, obtained by the previous frequency control, and the reflection coefficient value at the frequency $ω_a$ becomes a smaller value.

Since the recontrol conventionally performed cannot respond to the variation of the frequency characteristics as shown in FIG. 10(b), it is not possible to reduce the reflection coefficient by performing the frequency control again for this case.

In the recontrol of the frequency control according to the present invention, the frequency control can be performed again also for the case of such variation of the reflection coefficient as described above, allowing establishment of the frequency that minimizes the reflection coefficient value.

(Modes of Recontrol)

There will be described a mode of recontrol performed based on operational conditions, and a mode of the recontrol performed after a lapse of a predetermined time period.

Recontrol Based on Operational Conditions

FIG. 11(a) is a flowchart for describing the recontrol based on operational conditions, and FIGS. 12(a) and 12(b) are figures for describing the recontrol based on the operational conditions. The operational conditions may include, for example, variation of power supplied to the load, movement of structures within a chamber performing electrical discharge, and variation of gas conditions to be supplied within the chamber.

At the time of completing the frequency control, the reflection coefficient Γ and the reflection amount Wr are stored. Thresholds are preset, respectively, in association with the value of the reflection coefficient Γ and the reflection amount Wr. Then, the reflection coefficient Γ and the reflection amount Wr at the time of control end, and thus preset thresholds Δ (ΔΓ, ΔWr) are read out (S11). Differences are obtained, respectively, between the reflection coefficient Γ and the reflection amount Wr at the current time, and the reflection coefficient Γ and the reflection amount Wr at the time of control end (S12), and the differences are compared with thus read out thresholds Δ, thereby determining whether the recontrol is to be performed (S13).

In determining the recontrol, when each difference is less than the threshold Δ (S13), the current frequency is maintained (S14), and when the difference is equal to or larger than the threshold Δ (S14), the frequency control is performed again (S15).

FIGS. 12(a) and 12(b) illustrate examples of the recontrol based on the operational conditions. FIG. 12(a) shows the case where the reflection coefficient Γ and the reflection amount Wr are increased due to the variation of the operational conditions, and FIG. 12(b) shows the case where the reflection coefficient Γ and the reflection amount Wr are decreased due to the variation of the operational conditions.

At the time when the reflection coefficient Γ and the reflection amount Wr are minimized according to the frequency control, the frequency control is completed, and then, the current frequency is maintained. The operational conditions may vary in the state where the frequency is maintained. Due the variation of the operational conditions, the reflection coefficient Γ and the reflection amount Wr may increase or decrease. When the difference exceeds the threshold, the recontrol is performed to obtain a frequency at which the reflection coefficient Γ and the reflection amount Wr are reduced.

Recontrol Based on the State where Constancy Continues for a Predetermined Period of Time FIG. 11(b) is a flowchart for describing the recontrol based on the state where the reflection coefficient and/or the reflection amount continues to be high for a predetermined period of time, due to a cause such as unignited plasma, and FIG. 12(c) illustrates the recontrol.

The recontrol is performed when the reflection coefficient and/or the reflection amount continues to be high for a predetermined period of time. The frequency control circuit determines whether or not the reflection coefficient and/or the reflection amount continues to be high, for a time period longer than a predetermined time To, and when the duration of time exceeds the predetermined time To (S21), a recontrol signal is outputted and the frequency control is performed again.

FIG. 12(c) illustrates an example of the recontrol based on the state where the reflection coefficient and/or the reflection amount continues to be high for the predetermined period of time. When the reflection coefficient Γ and/or the reflection amount Wr is minimized according to the frequency control, the frequency control is completed, and then, the frequency at that time is maintained. When the state where the frequency is maintained for the predetermined period of time, the recontrol is performed, so as to obtain a frequency at which the reflection coefficient Γ and the reflection amount Wr are reduced.

(Determination of Recontrol)

Figure 13:
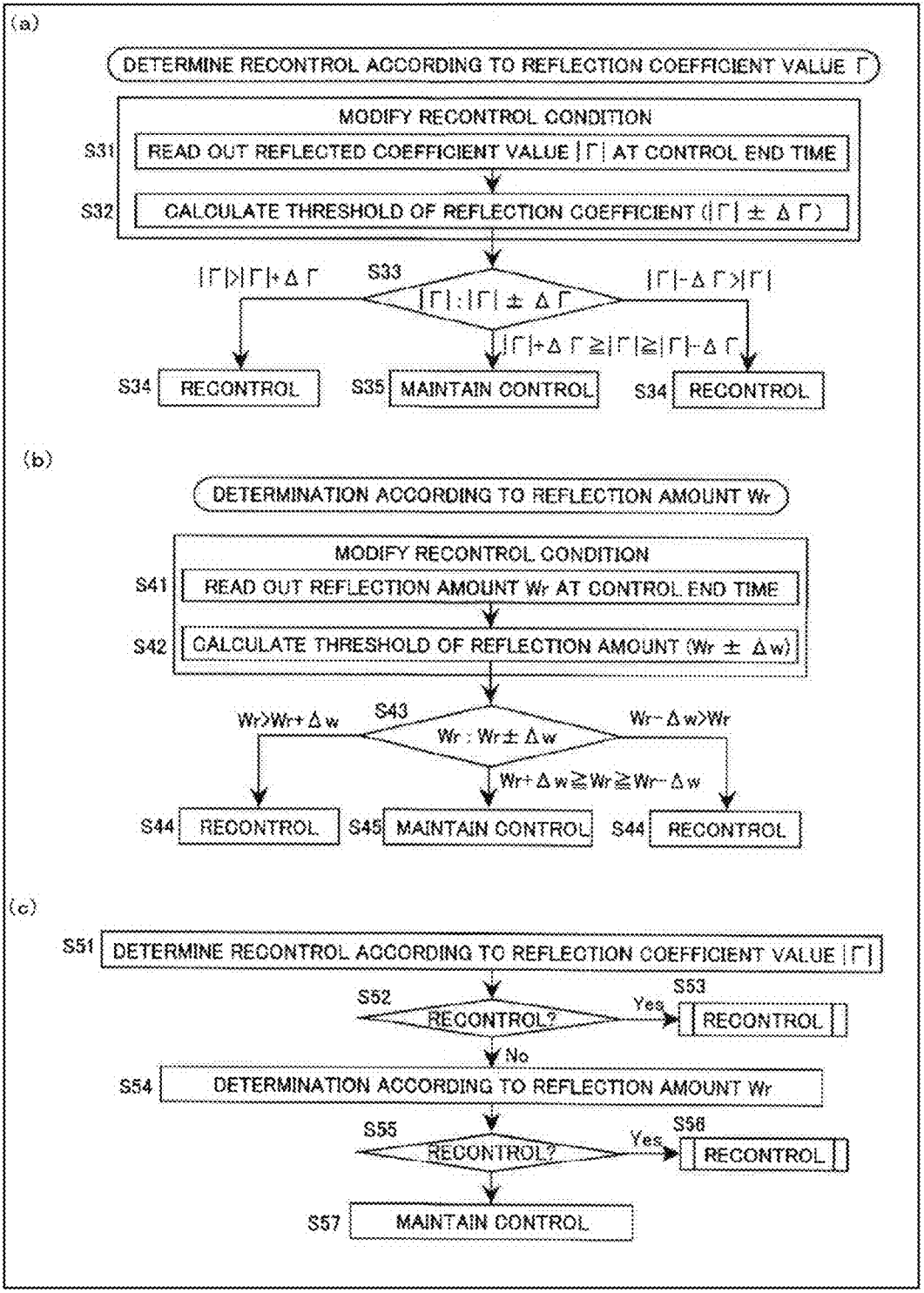
FIG. 13 shows flowcharts illustrating determination of the recontrol according to the present invention.
Figure 14:
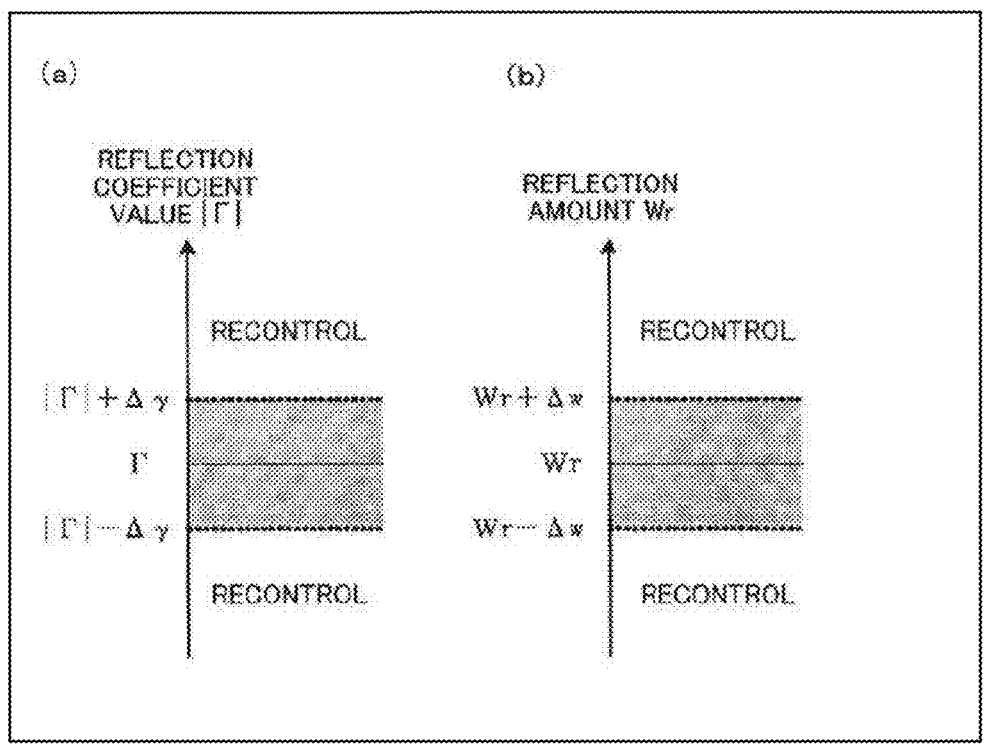
FIG. 14 illustrates ranges for determining the recontrol according to the present invention.
Figure 15:
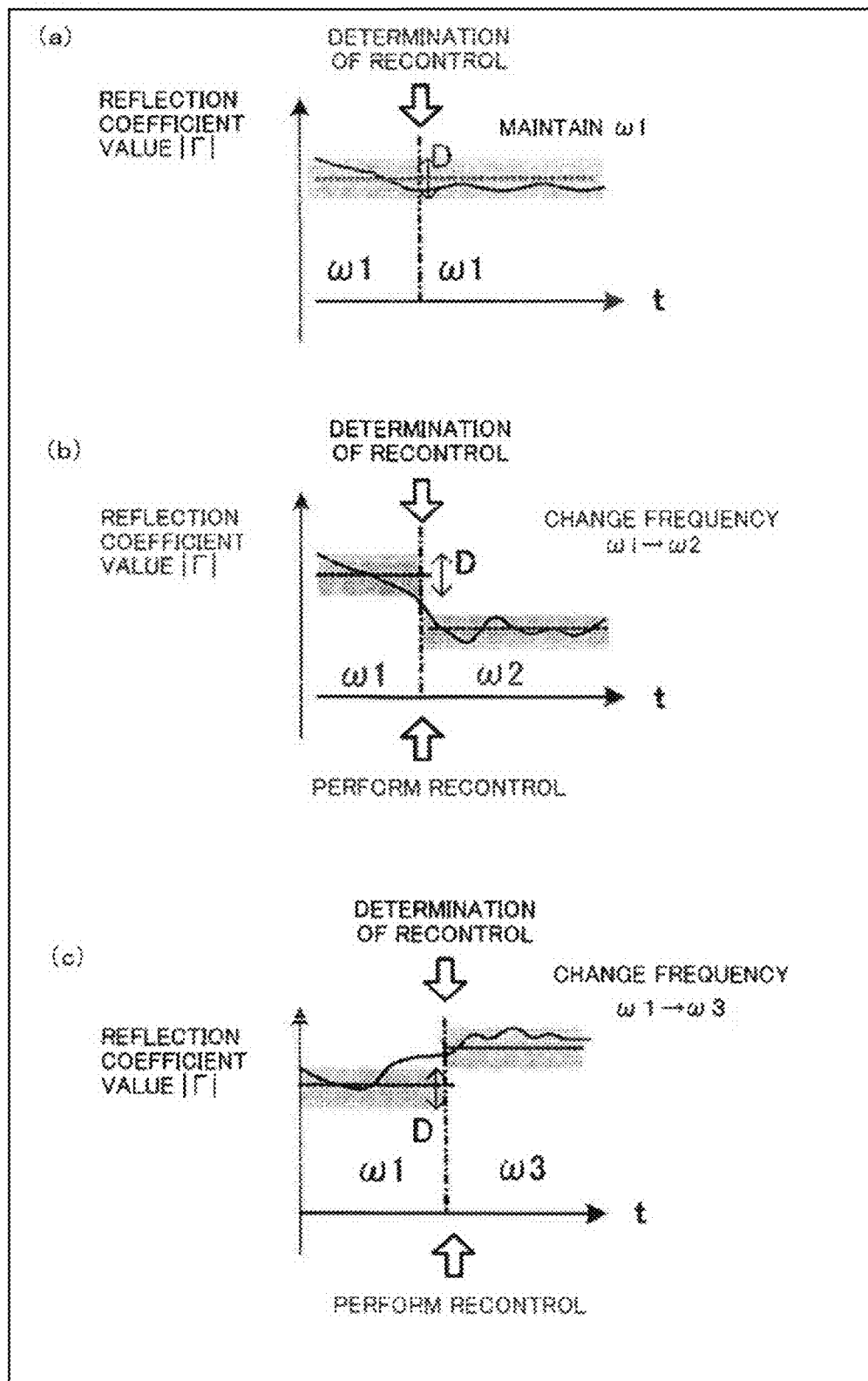
FIG. 15 illustrates operation examples for determining the recontrol according to the present invention.

Next, determination whether the recontrol is performed or not will be described, with reference to the flowchart of FIG. 13, FIG. 14 illustrating the range for determination, and FIG. 15 illustrating operational examples of the recontrol determination.

Determination of the recontrol can be performed according to following modes; a mode where the determination is made based on the absolute value |Γ| of the reflection coefficient Γ, and a mode where the determination is made based on the reflection amount Wr.

Determination Based on the Absolute Value |Γ| of the Reflection Coefficient Γ

In determining the recontrol based on the changed control end condition in S11, if it is determined based on the absolute value |Γ| of the reflection coefficient Γ, in the flowchart of FIG. 13(a), a reflection coefficient value Γ at the frequency of the frequency control end time is read out (S31), and the absolute value |Γ| of thus readout reflection coefficient value Γ is provided with a predetermined width ΔΓ, thereby defining a threshold range (|Γ|±ΔΓ), so as to provide the condition for the recontrol (S32). Then, the determination according to the absolute value |Γ| of the reflection coefficient Γ is based on the threshold range (|Γ|±ΔΓ) (S33).

When the absolute value |Γ| of the reflection coefficient Γ is out of the threshold range (|Γ|±ΔΓ), the recontrol is performed (S34), whereas when the absolute value |Γ| of the reflection coefficient Γ is within the threshold range (|Γ|±ΔΓ), the control at the current frequency is maintained (S35).

FIG. 14(a) illustrates the threshold range (|Γ|±ΔΓ) of the absolute value |Γ| of the reflection coefficient Γ. The threshold range may be widened upwardly and downwardly by ΔΓ from the value of |Γ|, and the recontrol can be performed not only when the reflection coefficient value is increased, but also when it is decreased.

Determination Based on the Reflection Amount Wr

In determining the recontrol based on the changed control end condition in S11, when it is determined according to the reflection amount Wr, in FIG. 13(b), the reflection amount Wr at the frequency of the frequency control end time is read out (S41), a predetermined width ±Δw is added to thus readout reflection amount Wr, thereby defining the threshold range (Wr±Δw), so as to provide the condition for the recontrol (S42). Then, the determination according to the reflection amount Wr is based on the threshold range (Wr±Δw) (S43).

When the reflection amount Wr is out of the threshold range (Wr±Δw), the recontrol is performed (S44), and when the reflection amount Wr is within the threshold range (Wr±Δw), the control at the current frequency is maintained (S45).

FIG. 14(b) illustrates the threshold range (Wr±Δw) of the reflection amount Wr. The threshold range may be widened upwardly and downwardly by Δw from the reflection amount Wr, and the recontrol can be performed not only when the reflection amount Wr is increased, but also when it is decreased.

Either one of the modes of determination, based on the absolute value |Γ| of the reflection coefficient Γ or based on the reflection amount Wr, may be performed for determining the recontrol, or both modes may be performed for determining the recontrol.

In FIG. 13(c), the recontrol is determined based on the absolute value |Γ| of the reflection coefficient Γ (S51), and as a result of determination (S52), if the recontrol is to be performed, it is performed (S53). As a result of determination (S52), if the recontrol is not to be performed, the determination based on the reflection amount Wr is performed (S54).

As a result of the recontrol determination based on the reflection amount Wr (S55), if the recontrol is to be performed, it is performed (S56). As a result of the recontrol determination (S55), if the recontrol is not to be performed, the control at the frequency obtained by the previous frequency control is maintained (S57).

(Operation Example of the Recontrol)

With reference to FIG. 15, an operation example of the recontrol will be described. There will be described the recontrol determination based on the absolute value |Γ| of the reflection coefficient.

FIG. 15(a) illustrates the control at the frequency obtained by the previous frequency control is maintained without performing the recontrol, as a result of the recontrol determination. As far as the absolute value |Γ| of the reflection coefficient is within the threshold range (|Γ|±ΔΓ), the frequency is maintained without performing the recontrol.

FIGS. 15(b) and 15(c) illustrate the recontrol is performed, and control at the frequency obtained by the frequency control is performed, as a result of the recontrol determination. In FIG. 15(b), if the absolute value |Γ| of the reflection coefficient goes out of the threshold range (|Γ|±ΔΓ) downwardly, the recontrol is performed and radio frequency at the frequency $\omega_2$ that is newly obtained by the recontrol is outputted. In FIG. 15(c), if the absolute value |Γ| of the reflection coefficient goes out of the threshold range (|Γ|±ΔΓ) upwardly, the recontrol is performed and radio frequency at the frequency $\omega_1$ that is newly obtained by the recontrol is outputted. In FIGS. 15(a) to 15(c), the threshold range (|Γ|±ΔΓ) is represented by the symbol D.

Figure 16:
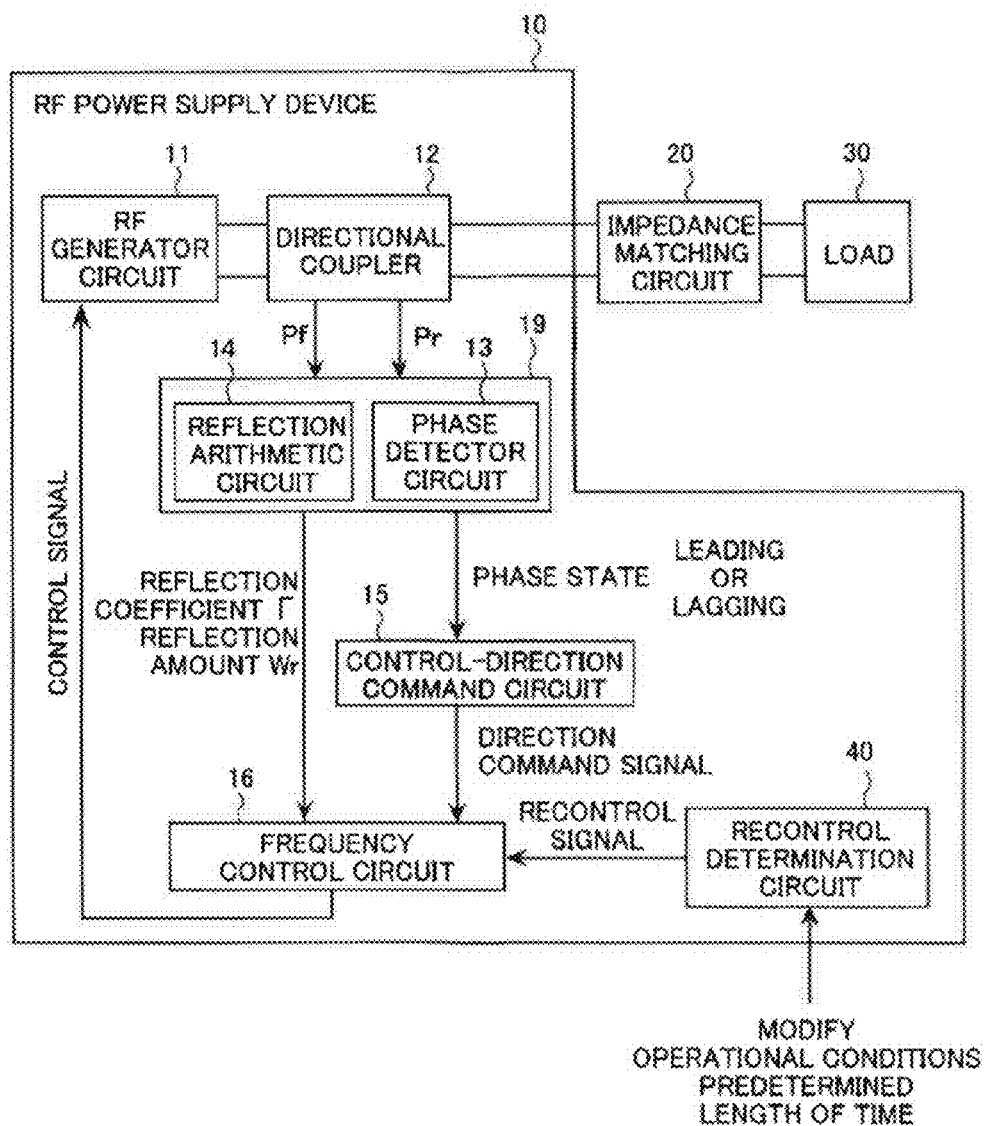
FIG. 16 shows a configuration example of the RF power supply device that performs the recontrol according to the present invention.
Figure 17:
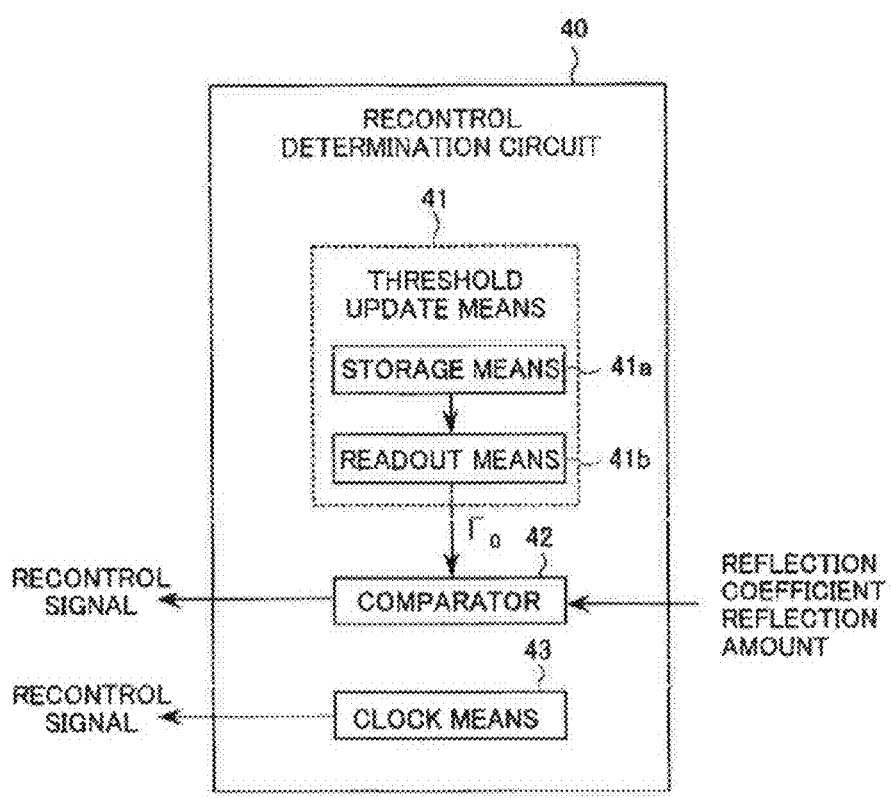
FIG. 17 shows a configuration example of a recontrol determination circuit according to the present invention.

FIG. 16 illustrates a configuration example of the RF power supply device for performing the recontrol, and FIG. 17 illustrates a configuration example of a recontrol determination circuit.

The RF power supply device 10 as shown in FIG. 16 has a configuration that the RF power supply device as shown in FIG. 4(a) is further provided with a recontrol determination circuit 40. The recontrol determination circuit 40 determines whether or not the recontrol is performed, based on the case where the operational conditions are modified or the case where the reflection coefficient and/or the reflection amount exceeds a preset value continuously for a certain length of time, and a recontrol signal is outputted to the frequency control circuit 16.

FIG. 17 illustrates one configuration example of the recontrol determination circuit 40. There are provided a threshold update means 41 for updating a threshold for determining the recontrol, and a comparison means 42 for comparing the reflection coefficient or the reflection amount, with the threshold.

The threshold update means 41 is provided with a storage means 41a for storing the threshold values determined depending on the operational conditions, and a read-out means 41b for reading out the threshold from the storage means 41a depending on the operational conditions. The comparison means 42 compares the reflection coefficient or the reflection amount, inputted from the arithmetic circuit 14, with the threshold read out from the readout means 41b, and outputs a recontrol signal to the frequency control circuit 16 for providing an instruction regarding the recontrol on the basis of the comparison result.

In addition, the recontrol determination circuit 40 is provided with a clock circuit 43, and a recontrol signal is outputted when the reflection coefficient and/or the reflection amount exceeds a set value continuously for a certain length of time.

(Phase Shift Compensation)

With reference to FIGS. 18 and 19, there will now be described phase shift compensation for compensating for a phase difference caused by a cable that is installed between the RF power supply device of the present invention and the load.

FIG. 18 illustrates a configuration where the RF power supply device 10 and the impedance matching circuit 20 are connected via a cable 50.

Assuming that the connection point between the RF power supply device 10 and the cable 50 is A and the connection point between the impedance matching circuit 20 and the cable 50 is B, further assuming that the phase of progressive wave at the point A is β, the phase of reflected wave is α, and the phase according to the cable is γ/2, the phase of the progressive wave is represented by (β−γ/2) and the phase of the reflected wave is represented by (α+γ/2), at the point B.

According to the phases described above, delays of the reflected wave with respect to the progressive wave, at the points A and B, are expressed as the following, respectively:

Point A:(reflected wave)−(progressive wave)=α−β=θ

Point B:(reflected wave)−(progressive wave)=(α+γ/2)−(β−γ/2)=α−β+γ=θ+γ

A directional coupler that is provided in the RF power supply device may detect amplitude Vf of the progressive wave, amplitude Vr of the reflected wave, and each of the phases (α, β) at the point A.

The amplitude at the point B can be assumed as being the same as the amplitude at the point A, and the phase of the cable length can be corrected by the phase shift amount γ. Therefore, by performing phase correction by the phase shift amount γ due to the cable length, on the detected values at the point A on the RF power supply device side, thereby obtaining an impedance locus at the point B on the matching circuit side.

According to the impedance locus at the point B, the phase of the reflection coefficient can be obtained, and similar to the aforementioned phase control, the sweep direction of the frequency control can be determined. Therefore, it is possible to compensate for the phase shift that depends on the cable length.

The relationship between the reflection coefficient and the impedance $Z_O$ at the point A can be expressed by the following formula:

$$Z_Z = Z_O\left(\frac{(1-\Gamma_z^2)}{1+\Gamma_z^2-2\Gamma_z\cos\theta} + j\frac{2\Gamma_z\sin\theta}{1+\Gamma_z^2-2\Gamma_z\cos\theta}\right) \quad (5)$$

$$= \frac{Z_0(1-\Gamma_z^2)}{1+\Gamma_z^2-2\Gamma_z\cos\theta} + j\frac{2Z_0\Gamma_z\sin\theta}{1+\Gamma_z^2-2\Gamma_z\cos\theta}$$

The directional coupler is capable of detecting the amplitude and the phase of the progressive wave and the reflected wave, and thus according to the amplitude ratio between the progressive wave and the reflected wave, scalar Γz of the reflection coefficient as shown in the formula 5 can be obtained. Assuming the phase of the progressive wave is β, and the phase of the reflected wave is α, (reflected wave)−(progressive wave)=α−β=θ, and sin θ, cos θ of the reflected wave with respect to the progressive wave as shown in the formula 5 can be obtained.

As described so far, according to the detection by the directional coupler at the point A, the phase and impedance at the point A can be calculated. In the formula 5, if it is only required to focus on whether the phase is positive or negative, it is possible to make determination based on the sign of sin θ only.

Next, the phase on the point B can be expressed by (reflected wave)−(progressive wave)=(α+γ/2)−(β−γ/2)=α−β+γ=θ+γ, and the impedance at the point B is expressed by the following formula, with respect to the formula 5 indicating the impedance at the point A:

$$Z_Z = Z_O\left(\frac{(1-\Gamma_z^2)}{1+\Gamma_z^2-2\Gamma_z\cos(\theta+\gamma)} + j\frac{2\Gamma_z\sin\theta}{1+\Gamma_z^2-2\Gamma_z(\theta+\gamma)}\right) \quad (6)$$

$$= \frac{Z_0(1-\Gamma_z^2)}{1+\Gamma_z^2-2\Gamma_z(\theta+\gamma)} + j\frac{2Z_0\Gamma_z\sin\theta}{1+\Gamma_z^2-2\Gamma_z(\theta+\gamma)}$$

The phase difference γ is calculated, and it is compensated for by the impedance calculation according to the formula 6, and the impedance at the point B on the matching circuit side can be obtained.

It is to be noted that already-known methods may be applicable for calculating γ. As one of the methods for calculating γ, the length of the cable connecting the RF power supply device with the matching circuit and a wavelength reduction rate are stored in the storage means, calculating an electrical length of the cable by dividing the cable length by the wavelength reduction rate, and then, thus obtained electrical length is converted into a phase angle, thereby calculating the phase shift amount γ.

In another method for calculating γ, a cable connected to the matching circuit side is disconnected in an actually installed power source system, and RF power is actually generated on the RF power supply device side, whereby the phase shift amount γ is calculated from the phase difference that is obtained from measured values of voltage and current across the cable.

FIG. 19 illustrates the compensation for phase shift due to the cable. FIG. 19(a) illustrates locus $L_{O1}$ of the impedance $Z_{in}$ viewed from the output end of the RF power supply device via the cable. The locus $L_{O1}$ indicates the phase shift due to the cable. FIG. 19(b) illustrates the locus $L_{O2}$ of the impedance $Z_{in}$ where the phase shift compensation has been performed. According to the phase shift compensation, the locus $L_{O2}$ indicates the impedance $Z_{in}$ viewed from the input end of the matching circuit.

Descriptions in the aforementioned embodiments and modification examples represent a part of the examples of the RF power supply device according to the present invention. Therefore, it is to be understood that the present invention is not limited to each of those embodiments, but it may be variously modified on the basis of the spirit of the present invention, and such modifications are not excluded from the scope of the invention.

INDUSTRIAL APPLICABILITY

The RF power supply device of the present invention may be applicable to supplying of RF power, to devices utilizing radio frequency, such as equipment for manufacturing a semiconductor, a liquid crystal panel, or the like, vacuum deposition equipment, and heating and melting equipment.

DESCRIPTION OF SYMBOLS

10 RF power supply device
11 RF generator circuit
12 directional coupler
13 phase detector circuit
14 reflection arithmetic circuit
15 control-direction command circuit
16 frequency control circuit
17 voltage detector
18 current detector
20 impedance matching circuit
30 load
40 recontrol determination circuit
41 threshold update means
41a storage means
41b read-out means
42 comparison means
43 clock circuit
50 cable

What is claimed is:

1. An RF power supply device for supplying RF power to a load involving electrical discharge, comprising,
an RF generator circuit configured to generate a variable frequency;
a frequency control circuit configured to output a control signal for controlling frequency change in the RF generator circuit:
a state-of-reflection detector circuit including, a phase detector circuit configured to detect a phase state of the RF generator circuit and a reflection arithmetic circuit configured to compute a reflection coefficient value and/or a reflection amount at an output end of the RF generator circuit,
a control-direction command circuit configured to output a direction command signal for providing a control direction where the frequency increases or decreases in the frequency change, on the basis of the phase state outputted from the phase detector circuit, and,
a recontrol circuit configured to output to the frequency control circuit, a recontrol signal for issuing a command to perform the frequency change again, wherein,
the frequency control circuit performs control for the RF generator circuit to generate the variable frequency, the control comprising,
phase control that controls increase or decrease of the frequency in the frequency change at the time of initiating the control, on the basis of the direction command signal outputted from the control-direction command circuit; and
reflected power control that controls continuing or stopping the frequency change at the time of completing the control, using as a control end condition, the reflection coefficient value and/or the reflection amount outputted from the reflection arithmetic circuit, and
outputting a control signal to the RF generator circuit on the basis of the recontrol signal, and
the recontrol circuit sets as a central value, the reflection coefficient value and/or the reflection amount at the frequency determined according to the frequency change, holds as a threshold range for determining whether or not the recontrol is to be performed, a range of the reflection coefficient and/or a range of the reflection amount, with a certain width above and below the central value, and
outputs the recontrol signal in at least either one of the case where the reflection coefficient value detected by the reflection arithmetic circuit is out of the range of the reflection coefficient, and the case where the reflection amount detected by the reflection arithmetic circuit is out of the range of the reflection amount.

2. The RF power supply device according to claim 1, wherein,
the recontrol circuit outputs the recontrol signal at predetermined time intervals, and
the frequency control circuit performs the reflected power control again, according to the recontrol signal.

3. The RF power supply device according to claim 1, wherein,
the phase detector circuit detects the phase state based on voltage and current at the output end of the RF generator circuit.

4. The RF power supply device according to claim 1, wherein,
the phase detector circuit detects the phase state according to a phase obtained based on voltage and current at the output end of the RF generator circuit and a phase shift on a transmission line.

5. The RF power supply device according to claim 1, further comprising,
a voltage detector and a current detector at the output end of the RF generator circuit, wherein, the phase detector circuit detects the phase state, on the basis of the voltage detected by the voltage detector and the current detected by the current detector.

6. The RF power supply device according to claim 1, further comprising, a direction detector at the output end of the RF generator circuit, wherein, the phase detector circuit detects the phase state from a phase difference between a phase based on voltage and current of a progressive wave and a phase based on voltage and current of a reflected wave, being separated waves obtained by the direction detector.

7. The RF power supply device according to claim 1, wherein, the phase detector circuit outputs a phase obtained by adding a phase shift component due to the transmission line, as the phase state at the output end of the RF generator circuit.

8. A method of controlling an RF power supply device configured to supply RF power to a load involving electrical discharge, in performing frequency control for controlling reflected power by impedance matching according to frequency change in the RF power supply device, comprising, a phase control step of defining a frequency sweep direction in which the frequency is increased or decreased in the frequency change, on the basis of a phase state of the RF power supply device at the time of initiating the control, and a reflected power control step of controlling, in the frequency change according to increasing or decreasing the frequency as defined in the phase control step, continuing or stopping the frequency change at the time of completing the control, using as a control end condition, a reflection coefficient value and/or a reflection amount of the RF power supply device, wherein, the reflection coefficient value and/or the reflection amount controlled to be a minimum at the frequency determined according to the frequency change is set as a central value, and a range of the reflection coefficient and/or a range of the reflection amount, with a certain width above and below the central value, is provided as a threshold range for determining whether or not recontrol is to be performed, and the recontrol is performed in at least either one of the case where the reflection coefficient value is out of the range of the reflection coefficient, and the case where the reflection amount is out of the range of the reflection amount.

9. The method of controlling the RF power supply device according to claim 8, wherein, the frequency control is performed again, when the state where the reflection coefficient and/or the reflection amount exceeds a set value continuously for a predetermined length of time.

10. The method of controlling the RF power supply device according to claim 8, wherein, the phase state is detected on the basis of voltage and current at an output end of the RF power supply device, or on the basis of a difference between a phase of a progressive wave and a phase of a reflected wave at the output end of the RF power supply device.

11. The method of controlling the RF power supply device according to claim 10, wherein, the phase state further includes a phase shift component on a transmission line.

* * * * *